US009249493B2

(12) United States Patent
Choi et al.

(10) Patent No.: US 9,249,493 B2
(45) Date of Patent: Feb. 2, 2016

(54) ORGANIC LAYER DEPOSITION APPARATUS AND METHOD OF MANUFACTURING ORGANIC LIGHT-EMITTING DISPLAY APPARATUS BY USING THE SAME

(75) Inventors: Myong-Hwan Choi, Yongin (KR); Mu-Hyun Kim, Yongin (KR); Sung-Bong Lee, Yongin (KR); Myung-Ki Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 937 days.

(21) Appl. No.: 13/470,077

(22) Filed: May 11, 2012

(65) Prior Publication Data

US 2012/0301986 A1 Nov. 29, 2012

(30) Foreign Application Priority Data

May 25, 2011 (KR) ........................ 10-2011-0049794

(51) Int. Cl.
*C23C 14/04* (2006.01)
*C23C 14/12* (2006.01)
*C23C 14/24* (2006.01)
*C23C 14/50* (2006.01)
*C23C 14/56* (2006.01)

(52) U.S. Cl.
CPC ............... *C23C 14/042* (2013.01); *C23C 14/12* (2013.01); *C23C 14/243* (2013.01); *C23C 14/50* (2013.01); *C23C 14/568* (2013.01)

(58) Field of Classification Search
CPC ........................................................ H01L 27/32
See application file for complete search history.

(56) References Cited

U.S. PATENT DOCUMENTS 4,416,217 A 11/1983 Nakamura et al.
4,468,648 A 8/1984 Uchikune (Continued)

FOREIGN PATENT DOCUMENTS

CN 1476279 A 2/2004
CN 1489419 A 4/2004

(Continued)

OTHER PUBLICATIONS

Patent Abstracts of Japan, and English machine translation of Japanese Publication 2001-052862, 20 pages.

(Continued)

*Primary Examiner* — Nathan T Leong
(74) *Attorney, Agent, or Firm* — Christie, Parker & Hale, LLP

(57) ABSTRACT

An organic layer deposition apparatus including: a deposition source configured to discharge a deposition material; a deposition source nozzle unit arranged at a side of the deposition source and including a plurality of deposition source nozzles; a patterning slit sheet facing the deposition source nozzle unit and including a plurality of patterning slits, the patterning slit sheet being smaller than the substrate in at least one of a first direction or a second direction perpendicular to the first direction; a blocking member configured to be disposed between the substrate and the deposition source to block at least a portion of the substrate; and a heating member on the blocking member and configured to heat the blocking member, and the substrate is spaced apart from the organic layer deposition apparatus by a predetermined distance, and the substrate or the organic layer deposition apparatus is movable relative to the other.

14 Claims, 9 Drawing Sheets

620
600
500
719
100 200 300 400
729
x
y
712 714 716 718 731 610 728 726 724 722
710 600 730 600 720

(56) References Cited

U.S. PATENT DOCUMENTS 4,687,939 A 8/1987 Miyauchi et al.
4,792,378 A 12/1988 Rose et al.
4,901,667 A 2/1990 Suzuki et al.
5,454,847 A 10/1995 Jacoboni et al.
5,460,654 A 10/1995 Kikkawa et al.
5,487,609 A 1/1996 Asada
5,742,129 A 4/1998 Nagayama et al.
5,909,995 A 6/1999 Wolf et al.
6,091,195 A 7/2000 Forrest et al.
6,099,649 A 8/2000 Schmitt et al.
6,222,198 B1 4/2001 Brown
6,274,198 B1 8/2001 Dautartas
6,280,821 B1 8/2001 Kadunce et al.
6,371,451 B1 4/2002 Choi
6,417,034 B2 7/2002 Kitazume et al.
6,443,597 B1 9/2002 Natori
6,483,690 B1 11/2002 Nakajima et al.
6,541,130 B2 4/2003 Fukuda
6,554,969 B1 4/2003 Chong
6,579,422 B1 6/2003 Kakinuma
6,589,673 B1 7/2003 Kido et al.
6,650,023 B2 11/2003 Kim
6,699,324 B1 3/2004 Berdin et al.
6,749,906 B2 * 6/2004 Van Slyke .................... 427/591
6,776,847 B2 8/2004 Yamazaki et al.
6,837,939 B1 1/2005 Klug et al.
6,878,209 B2 4/2005 Himeshima et al.
6,946,783 B2 9/2005 Kim
6,995,035 B2 2/2006 Cok et al.
7,006,202 B2 2/2006 Byun et al.
RE39,024 E 3/2006 Takahashi
7,078,070 B2 7/2006 Peng
7,199,520 B2 4/2007 Fujii et al.
7,282,855 B2 10/2007 Park et al.
7,322,248 B1 1/2008 Long
7,495,389 B2 2/2009 Noguchi et al.
7,601,439 B2 10/2009 Chun et al.
7,776,457 B2 8/2010 Lee et al.
7,872,256 B2 1/2011 Sung et al.
7,910,386 B2 3/2011 Shiang et al.
7,964,037 B2 6/2011 Fukuda et al.
8,022,448 B1 9/2011 Luu et al.
8,128,753 B2 3/2012 Bulovic et al.
8,137,466 B2 3/2012 Kang et al.
8,188,476 B2 5/2012 Takagi et al.
8,193,011 B2 6/2012 Kang et al.
8,673,077 B2 3/2014 Sonoda et al.
2001/0004186 A1 6/2001 Song et al.
2001/0006827 A1 7/2001 Yamazaki et al.
2001/0019807 A1 9/2001 Yamada et al.
2001/0026638 A1 10/2001 Sangu et al.
2001/0034175 A1 10/2001 Miyazaki et al.
2002/0011785 A1 1/2002 Tang et al.
2002/0017245 A1 2/2002 Tsubaki et al.
2002/0033136 A1 3/2002 Savage et al.
2002/0076847 A1 6/2002 Yamada et al.
2002/0168577 A1 11/2002 Yoon
2002/0179013 A1 12/2002 Kido et al.
2002/0187253 A1 12/2002 Marcus et al.
2002/0194727 A1 12/2002 Cho et al.
2002/0197393 A1 12/2002 Kuwabara
2003/0101932 A1 6/2003 Kang
2003/0101937 A1 6/2003 Van Slyke et al.
2003/0117602 A1 6/2003 Kobayashi et al.
2003/0118950 A1 6/2003 Chao et al.
2003/0124764 A1 7/2003 Yamazaki et al.
2003/0151637 A1 8/2003 Nakamura et al.
2003/0164934 A1 9/2003 Nishi et al.
2003/0168013 A1 9/2003 Freeman et al.
2003/0173896 A1 9/2003 Grushin et al.
2003/0221614 A1 12/2003 Kang et al.
2003/0221620 A1 12/2003 Yamazaki
2003/0232563 A1 12/2003 Kamiyama et al.
2004/0016907 A1 1/2004 Shi
2004/0028349 A1 2/2004 Nagasaka et al.
2004/0029028 A1 2/2004 Shimizu
2004/0056244 A1 3/2004 Marcus et al.
2004/0062856 A1 4/2004 Marcus et al.
2004/0086639 A1 5/2004 Grantham et al.
2004/0096771 A1 5/2004 Kashiwagi et al.
2004/0115338 A1 6/2004 Yoneda
2004/0115342 A1 6/2004 Shigemura
2004/0123804 A1 7/2004 Yamazaki et al.
2004/0127066 A1 7/2004 Jung
2004/0134428 A1 7/2004 Sasaki et al.
2004/0142108 A1 7/2004 Atobe et al.
2004/0144321 A1 7/2004 Grace et al.
2004/0157167 A1 8/2004 Morii
2004/0183435 A1 9/2004 Ohshita
2004/0194702 A1 10/2004 Sasaki et al.
2004/0195530 A1 10/2004 Kwak et al.
2004/0216673 A1 11/2004 Sakata et al.
2004/0255857 A1 12/2004 Chow et al.
2004/0263547 A1 12/2004 Sugahara
2004/0263771 A1 12/2004 Jeong et al.
2005/0001546 A1 1/2005 Yamaguchi
2005/0016461 A1 1/2005 Klug et al.
2005/0031836 A1 2/2005 Hirai
2005/0037136 A1 2/2005 Yamamoto
2005/0039684 A1 2/2005 Yi et al.
2005/0072359 A1 4/2005 Kim
2005/0072361 A1 4/2005 Yang et al.
2005/0079418 A1 4/2005 Kelley et al.
2005/0110400 A1 5/2005 Nakamura
2005/0118788 A1 6/2005 Kuwahara et al.
2005/0129489 A1 6/2005 Quan et al.
2005/0153472 A1 7/2005 Yotsuya
2005/0166842 A1 8/2005 Sakamoto
2005/0166844 A1 8/2005 Gralenski
2005/0183670 A1 8/2005 Grantham et al.
2005/0186330 A1 8/2005 Kim et al.
2005/0213021 A1 9/2005 Myoung
2005/0217584 A1 10/2005 Abiko et al.
2005/0229848 A1 10/2005 Shinriki et al.
2005/0244580 A1 11/2005 Cok et al.
2005/0263074 A1 12/2005 Masuda et al.
2005/0280356 A1 12/2005 Murayama et al.
2006/0011136 A1 1/2006 Yamazaki et al.
2006/0012280 A1 1/2006 Kang et al.
2006/0012771 A1 1/2006 Jeong
2006/0022590 A1 2/2006 Aziz et al.
2006/0040132 A1 2/2006 Liao et al.
2006/0045958 A1 3/2006 Abiko et al.
2006/0066231 A1 3/2006 Nishikawa et al.
2006/0090705 A1 5/2006 Kim
2006/0102078 A1 5/2006 Fairbairn et al.
2006/0110544 A1 5/2006 Kim et al.
2006/0113907 A1 6/2006 Im et al.
2006/0115585 A1 6/2006 Bulovic et al.
2006/0130766 A1 6/2006 Kim et al.
2006/0144325 A1 7/2006 Jung et al.
2006/0152641 A1 7/2006 Brody
2006/0164786 A1 7/2006 Kobayashi et al.
2006/0169211 A1 8/2006 Kim et al.
2006/0174829 A1 * 8/2006 An et al. ......................... 118/52
2006/0205101 A1 9/2006 Lee et al.
2006/0244696 A1 11/2006 Jung et al.
2006/0267294 A1 11/2006 Busse et al.
2006/0269671 A1 11/2006 Kim et al.
2006/0272572 A1 12/2006 Uematsu et al.
2006/0278522 A1 12/2006 Kim et al.
2006/0278945 A1 12/2006 Sakurai
2006/0280588 A1 12/2006 Blonigan et al.
2007/0009552 A1 1/2007 Whitehead et al.
2007/0009652 A1 1/2007 Manz et al.
2007/0017445 A1 1/2007 Takehara et al.
2007/0022955 A1 2/2007 Bender et al.
2007/0024185 A1 2/2007 Kitamura et al.
2007/0046185 A1 3/2007 Kim
2007/0046913 A1 3/2007 Shibazaki
2007/0054044 A1 3/2007 Shimosaki et al.
2007/0075955 A1 4/2007 Jung et al.
2007/0077358 A1 4/2007 Jeong et al.
2007/0137568 A1 6/2007 Schreiber

(56) References Cited

U.S. PATENT DOCUMENTS

2007/0148337 A1 6/2007 Nichols et al.
2007/0148348 A1 6/2007 Huh et al.
2007/0157879 A1 7/2007 Yotsuya et al.
2007/0158471 A1 7/2007 Park et al.
2007/0163497 A1 7/2007 Grace et al.
2007/0178708 A1 8/2007 Ukigaya
2007/0195844 A1 8/2007 Ma et al.
2007/0231460 A1 10/2007 Ukigaya
2007/0235157 A1 10/2007 Bunker et al.
2007/0275497 A1 11/2007 Kwack et al.
2007/0297887 A1 12/2007 Tanaka
2008/0018236 A1 1/2008 Arai et al.
2008/0038935 A1 2/2008 Baude et al.
2008/0057183 A1 3/2008 Spindler et al.
2008/0100204 A1 5/2008 Kim
2008/0115729 A1* 5/2008 Oda et al. ...................... 118/726
2008/0118743 A1* 5/2008 Lee et al. ...................... 428/332
2008/0129194 A1 6/2008 Abe et al.
2008/0131587 A1 6/2008 Boroson et al.
2008/0145521 A1 6/2008 Guo et al.
2008/0174235 A1 7/2008 Kim et al.
2008/0202421 A1 8/2008 Allen et al.
2008/0216741 A1 9/2008 Ling
2008/0238294 A1 10/2008 Xu et al.
2008/0251785 A1 10/2008 Noh et al.
2008/0286461 A1 11/2008 Noguchi et al.
2008/0290791 A1 11/2008 Lee et al.
2008/0298947 A1 12/2008 Yeo et al.
2008/0309718 A1 12/2008 Oya et al.
2009/0001882 A1 1/2009 Park et al.
2009/0014412 A1 1/2009 Nozawa et al.
2009/0017192 A1 1/2009 Matsuura
2009/0027767 A1 1/2009 Souriau et al.
2009/0124033 A1 5/2009 Moriyama
2009/0133629 A1 5/2009 Kamikawa et al.
2009/0153033 A1 6/2009 Lee et al.
2009/0165713 A1 7/2009 Kim et al.
2009/0169868 A1 7/2009 Haglund, Jr. et al.
2009/0181163 A1 7/2009 Uetake
2009/0208754 A1 8/2009 Chu et al.
2009/0220691 A1 9/2009 Kim
2009/0232976 A1 9/2009 Yoon et al.
2009/0269881 A1 10/2009 Furuta et al.
2009/0277386 A1 11/2009 Takagi et al.
2009/0279173 A1 11/2009 Chui et al.
2009/0302750 A1 12/2009 Jun et al.
2009/0304906 A1 12/2009 Suduo et al.
2009/0304924 A1 12/2009 Gadgil
2009/0308317 A1 12/2009 Sone et al.
2009/0315456 A1 12/2009 Furukawa et al.
2010/0001301 A1 1/2010 Karg et al.
2010/0086672 A1 4/2010 Von Drasek et al.
2010/0089443 A1 4/2010 Bloomstein et al.
2010/0090594 A1 4/2010 Choi et al.
2010/0130020 A1 5/2010 Kim et al.
2010/0156279 A1 6/2010 Tamura et al.
2010/0170439 A1 7/2010 Negishi
2010/0192856 A1 8/2010 Sung et al.
2010/0196607 A1 8/2010 Carlson et al.
2010/0248416 A1 9/2010 Priddy et al.
2010/0255198 A1 10/2010 Cleary et al.
2010/0271602 A1 10/2010 Hanazaki
2010/0275842 A1 11/2010 Park et al.
2010/0297348 A1 11/2010 Lee et al.
2010/0297349 A1 11/2010 Lee et al.
2010/0310768 A1 12/2010 Lee et al.
2010/0316801 A1 12/2010 Lee et al.
2010/0328197 A1 12/2010 Lee et al.
2010/0330265 A1 12/2010 Lee et al.
2010/0330712 A1 12/2010 Lee et al.
2011/0033619 A1 2/2011 Lee et al.
2011/0033621 A1 2/2011 Lee et al.
2011/0042659 A1 2/2011 Kim et al.
2011/0048320 A1 3/2011 Choi et al.
2011/0052791 A1 3/2011 Jo et al.
2011/0052795 A1 3/2011 Choi et al.
2011/0053296 A1 3/2011 Lee et al.
2011/0068331 A1 3/2011 Koh et al.
2011/0123707 A1 5/2011 Lee et al.
2011/0139069 A1 6/2011 Ahn et al.
2011/0165327 A1 7/2011 Park et al.
2011/0168986 A1 7/2011 Lee et al.
2011/0220022 A1 9/2011 Hong et al.
2011/0241438 A1 10/2011 Kim et al.
2011/0262625 A1 10/2011 Park et al.
2011/0266944 A1 11/2011 Song et al.
2012/0006259 A1 1/2012 Sung et al.
2012/0009328 A1 1/2012 Ryu et al.
2012/0009332 A1 1/2012 Kim et al.
2012/0009706 A1 1/2012 Choi et al.
2012/0028390 A1 2/2012 Lee et al.
2012/0068199 A1 3/2012 Sung et al.
2012/0068201 A1 3/2012 Sung et al.
2012/0070928 A1 3/2012 Kim et al.
2012/0083061 A1 4/2012 Kang et al.
2012/0097992 A1 4/2012 Jeong
2012/0100282 A1 4/2012 Lee et al.
2012/0103253 A1 5/2012 Park et al.
2012/0132137 A1 5/2012 Oh et al.
2012/0145077 A1 6/2012 Chang et al.
2012/0148743 A1 6/2012 Bulovic et al.
2012/0174865 A1 7/2012 Choi et al.
2012/0175605 A1 7/2012 Shin et al.
2012/0183676 A1 7/2012 Sonoda et al.
2012/0214263 A1 8/2012 Yamazaki et al.
2012/0299023 A1 11/2012 Lee et al.
2012/0299024 A1 11/2012 Lee et al.
2012/0301614 A1 11/2012 Choi et al.
2012/0301986 A1 11/2012 Choi et al.
2012/0313251 A1 12/2012 Kato
2013/0001528 A1 1/2013 Chang et al.
2013/0008379 A1 1/2013 Chang et al.
2013/0032829 A1 2/2013 Sung et al.
2013/0157016 A1 6/2013 Kim
2013/0217164 A1 8/2013 Kang et al.
2013/0291796 A1 11/2013 Inoue et al.
2013/0298829 A1 11/2013 Jo et al.
2013/0341598 A1 12/2013 Chang et al.
2014/0010957 A1 1/2014 Inoue et al.
2014/0014917 A1 1/2014 Lee et al.
2014/0014918 A1 1/2014 Han
2014/0014920 A1 1/2014 Lee
2014/0014921 A1 1/2014 Choi
2014/0014924 A1 1/2014 Oh et al.
2014/0014929 A1 1/2014 Lee et al.
2014/0034917 A1 2/2014 Lee et al.
2014/0045343 A1 2/2014 Choi et al.
2014/0077168 A1 3/2014 Kim
2014/0084262 A1 3/2014 Kim
2014/0084263 A1 3/2014 Jin et al.
2014/0110680 A1 4/2014 Choe
2014/0131667 A1 5/2014 Chang

FOREIGN PATENT DOCUMENTS

CN 1500904 A 6/2004
CN 1556872 A 12/2004
CN 1607868 A 4/2005
CN 1682569 A 10/2005
CN 1704501 A 12/2005
CN 1716102 A 1/2006
CN 1814854 A 8/2006
CN 1841696 A 10/2006
EP 1 413 644 A2 4/2004
EP 1 418 250 A2 5/2004
EP 1 518 940 A1 3/2005
EP 2354270 A1 8/2011
JP 57-194252 A2 11/1982
JP 2-247372 10/1990
JP 04-272170 9/1992
JP 5-22405 U1 3/1993
JP 5-98425 A2 4/1993
JP 5-230628 A2 9/1993
JP 8-27568 A2 1/1996

(56) References Cited

FOREIGN PATENT DOCUMENTS

JP 9-95776 A2 4/1997
JP 10-50478 2/1998
JP 10-120171 5/1998
JP 10-270535 10/1998
JP 11-144865 5/1999
JP 2000-068054 3/2000
JP 2000-282219 10/2000
JP 2000-323277 11/2000
JP 2001-28325 A2 1/2001
JP 2001-052862 2/2001
JP 2001-093667 4/2001
JP 2002-75638 A2 3/2002
JP 2002-175878 6/2002
JP 2002-348659 A2 12/2002
JP 2003-003250 1/2003
JP 2003-077662 3/2003
JP 2003-157973 5/2003
JP 2003-197531 A2 7/2003
JP 2003-297562 10/2003
JP 2003-321767 11/2003
JP 2003-347394 A2 12/2003
JP 2004-035964 A2 2/2004
JP 2004-043898 2/2004
JP 2004-76150 A2 3/2004
JP 2004-91858 A2 3/2004
JP 2004-103269 4/2004
JP 2004-103341 4/2004
JP 2004-107764 A2 4/2004
JP 2004-137583 A2 5/2004
JP 2004-143521 A2 5/2004
JP 2004-169169 A2 6/2004
JP 2004-199919 7/2004
JP 2004-225058 8/2004
JP 2004-342455 A2 12/2004
JP 2004-349101 12/2004
JP 2004-355975 12/2004
JP 2005-044592 2/2005
JP 2005-101505 4/2005
JP 2005-122980 A 5/2005
JP 2005-163099 6/2005
JP 2005-165015 A2 6/2005
JP 2005-174843 A2 6/2005
JP 2005-206939 A2 8/2005
JP 2005-213616 A2 8/2005
JP 2005-235568 9/2005
JP 2005-293968 10/2005
JP 2005-296737 10/2005
JP 2006-28583 A2 2/2006
JP 2006-172930 A2 6/2006
JP 2006-176809 A2 7/2006
JP 2006-210038 A2 8/2006
JP 2006-219760 8/2006
JP 2006-275433 10/2006
JP 2006-292955 A2 10/2006
JP 2006-307247 A2 11/2006
JP 2007-047293 2/2007
JP 2007-66862 3/2007
JP 2007-146219 6/2007
JP 2007-157886 6/2007
JP 2007-186740 7/2007
JP 2007-242436 9/2007
JP 2007-291506 A2 11/2007
JP 2008-19477 A2 1/2008
JP 2008-108628 5/2008
JP 2008-121098 5/2008
JP 2008-521165 A 6/2008
JP 2008-156686 7/2008
JP 2008-196003 8/2008
JP 2008-248301 A2 10/2008
JP 2008-274373 11/2008
JP 2008-300056 12/2008
JP 2009-019243 1/2009
JP 2009-24208 A2 2/2009
JP 2009-049223 3/2009
JP 2009-81165 A2 4/2009
JP 2009-87910 4/2009
JP 2009-117231 A2 5/2009
JP 2009-520110 5/2009
JP 2010-159167 A2 7/2010
JP 2010-261081 A2 11/2010
JP 2011-47035 3/2011
JP 2011-146377 7/2011
JP 2012-92448 5/2012
JP 2012-211352 11/2012
KR 1997-0008709 A 2/1997
KR 10-0257219 B1 2/2000
KR 10-2000-0019254 4/2000
KR 10-2000-0023929 5/2000
KR 2001-0024652 3/2001
KR 2001-0030175 A 4/2001
KR 10-2001-0039298 A 5/2001
KR 10-2001-0059939 7/2001
KR 10-2001-0092914 A 10/2001
KR 2001-0093666 A 10/2001
KR 20-0257218 11/2001
KR 10-2002-0000201 1/2002
KR 2002-0001555 1/2002
KR 2002-0025760 4/2002
KR 10-2002-0050922 6/2002
KR 2002-0088662 A 11/2002
KR 10-2002-0090934 12/2002
KR 10-2002-0091457 A 12/2002
KR 10-2003-0001745 1/2003
KR 2003-0001745 A 1/2003
KR 2003-0034730 A 5/2003
KR 10-2003-0043012 A 6/2003
KR 2003-0046090 6/2003
KR 2003-0069684 A 8/2003
KR 10-0405080 B1 11/2003
KR 10-0406059 B1 11/2003
KR 10-2003-0091947 12/2003
KR 10-2003-0093959 12/2003
KR 2003-0094033 A 12/2003
KR 10-2004-0014258 A 2/2004
KR 20-0342433 Y1 2/2004
KR 10-2004-0034537 4/2004
KR 10-2004-0039910 A 5/2004
KR 10-0430336 B1 5/2004
KR 10-2004-0050045 6/2004
KR 10-2004-0069281 8/2004
KR 10-2004-0084747 10/2004
KR 10-2004-0087142 A 10/2004
KR 10-2004-0110718 A 12/2004
KR 10-0463212 B1 12/2004
KR 10-2005-0024324 A 3/2005
KR 10-2005-0028943 3/2005
KR 10-2005-0039140 A 4/2005
KR 10-0483487 B1 4/2005
KR 10-2005-0062853 A 6/2005
KR 10-2005-0082644 A 8/2005
KR 10-0520159 B1 10/2005
KR 10-0532657 B1 12/2005
KR 10-2006-0008602 1/2006
KR 10-2006-0008602 A 1/2006
KR 10-2006-0018745 3/2006
KR 10-2006-0020050 3/2006
KR 10-2006-0045225 A 5/2006
KR 10-2006-0049050 5/2006
KR 10-2006-0051746 A 5/2006
KR 10-2006-0053926 A 5/2006
KR 10-2006-0056706 5/2006
KR 10-2006-0058459 5/2006
KR 10-2006-0059068 6/2006
KR 10-2006-0059323 A 6/2006
KR 10-2006-0060994 6/2006
KR 10-2006-0065978 6/2006
KR 10-2006-0073367 6/2006
KR 10-2006-0077887 A 7/2006
KR 10-2006-0080475 7/2006
KR 10-2006-0080481 7/2006
KR 10-2006-0080482 7/2006
KR 10-2006-0081943 A 7/2006
KR 10-2006-0083510 7/2006
KR 10-2006-0092387 8/2006

(56) References Cited

FOREIGN PATENT DOCUMENTS

| | | | |
|---|---|---|---|
| KR | 10-2006-0098755 | | 9/2006 |
| KR | 10-2006-0104288 | A | 10/2006 |
| KR | 10-2006-0104675 | | 10/2006 |
| KR | 10-2006-0104677 | | 10/2006 |
| KR | 10-2006-0109561 | A | 10/2006 |
| KR | 10-2006-0109627 | | 10/2006 |
| KR | 10-0635903 | | 10/2006 |
| KR | 10-2006-0114462 | A | 11/2006 |
| KR | 10-2006-0114477 | A | 11/2006 |
| KR | 10-2006-0114573 | A | 11/2006 |
| KR | 10-0645719 | | 11/2006 |
| KR | 10-0646160 | B1 | 11/2006 |
| KR | 10-2006-0123944 | A | 12/2006 |
| KR | 10-0687007 | B1 | 2/2007 |
| KR | 10-2007-0025164 | | 3/2007 |
| KR | 10-0696547 | B1 | 3/2007 |
| KR | 10-0696550 | B1 | 3/2007 |
| KR | 10-0697663 | | 3/2007 |
| KR | 10-0698033 | B1 | 3/2007 |
| KR | 10-0700466 | B1 | 3/2007 |
| KR | 10-2007-0035796 | | 4/2007 |
| KR | 10-2007-0037848 | A | 4/2007 |
| KR | 10-0711885 | B1 | 4/2007 |
| KR | 10-2007-0050793 | | 5/2007 |
| KR | 10-0723627 | B1 | 5/2007 |
| KR | 10-2007-0056190 | A | 6/2007 |
| KR | 10-0726132 | B1 | 6/2007 |
| KR | 10-0736218 | B1 | 7/2007 |
| KR | 10-0739309 | | 7/2007 |
| KR | 10-0741142 | B1 | 7/2007 |
| KR | 10-2007-0078713 | | 8/2007 |
| KR | 10-2007-0080635 | | 8/2007 |
| KR | 10-2007-0091437 | A | 9/2007 |
| KR | 10-2006-0028115 | | 10/2007 |
| KR | 10-2007-0098122 | A | 10/2007 |
| KR | 10-2007-0101842 | | 10/2007 |
| KR | 10-2007-0105595 | | 10/2007 |
| KR | 10-0768212 | B1 | 10/2007 |
| KR | 10-0770653 | B1 | 10/2007 |
| KR | 10-2007-0112668 | | 11/2007 |
| KR | 10-2007-0114094 | A | 11/2007 |
| KR | 10-0787457 | B1 | 12/2007 |
| KR | 10-2008-0001184 | | 1/2008 |
| KR | 10-2008-0003720 | A | 1/2008 |
| KR | 10-2008-0009285 | A | 1/2008 |
| KR | 10-0797787 | B1 | 1/2008 |
| KR | 10-0800125 | | 1/2008 |
| KR | 10-2008-0007896 | A | 2/2008 |
| KR | 10-0815265 | | 3/2008 |
| KR | 10-2008-0036983 | A | 4/2008 |
| KR | 10-0823508 | B1 | 4/2008 |
| KR | 10-0823511 | B1 | 4/2008 |
| KR | 10-2008-0044239 | A | 5/2008 |
| KR | 10-2008-0044775 | A | 5/2008 |
| KR | 10-2008-0046761 | A | 5/2008 |
| KR | 10-0827760 | B1 | 5/2008 |
| KR | 10-2008-0048653 | | 6/2008 |
| KR | 10-2008-0055124 | A | 6/2008 |
| KR | 10-2008-0057159 | A | 6/2008 |
| KR | 10-0839380 | B1 | 6/2008 |
| KR | 10-2008-0060400 | | 7/2008 |
| KR | 10-2008-0061132 | | 7/2008 |
| KR | 10-2008-0061666 | A | 7/2008 |
| KR | 10-2008-0061774 | A | 7/2008 |
| KR | 10-2008-0062212 | | 7/2008 |
| KR | 10-2008-0076574 | A | 8/2008 |
| KR | 10-2008-0088737 | A | 10/2008 |
| KR | 10-2008-0104479 | A | 12/2008 |
| KR | 10-2008-0104695 | A | 12/2008 |
| KR | 10-2008-0109559 | | 12/2008 |
| KR | 10-2009-0017910 | A | 2/2009 |
| KR | 10-0889872 | B1 | 3/2009 |
| KR | 10-2009-0038733 | | 4/2009 |
| KR | 10-2009-0047953 | A | 5/2009 |
| KR | 10-2009-0052155 | A | 5/2009 |
| KR | 10-2009-0052828 | A | 5/2009 |
| KR | 10-2009-0053417 | A | 5/2009 |
| KR | 10-0899279 | B1 | 5/2009 |
| KR | 10-2009-0066996 | A | 6/2009 |
| KR | 10-2009-0075887 | A | 7/2009 |
| KR | 10-2009-0079765 | A | 7/2009 |
| KR | 10-2009-0081717 | A | 7/2009 |
| KR | 10-2009-0093161 | | 9/2009 |
| KR | 10-2009-0094911 | A | 9/2009 |
| KR | 10-2009-0097453 | | 9/2009 |
| KR | 10-2009-0107702 | | 10/2009 |
| KR | 10-0922763 | A | 10/2009 |
| KR | 10-2010-0000128 | | 1/2010 |
| KR | 10-2010-0000129 | A | 1/2010 |
| KR | 10-2010-0002381 | A | 1/2010 |
| KR | 10-2010-0026655 | A | 3/2010 |
| KR | 10-2010-0038088 | A | 4/2010 |
| KR | 10-2010-0044606 | A | 4/2010 |
| KR | 10-2010-0047796 | | 5/2010 |
| KR | 10-0961110 | B1 | 6/2010 |
| KR | 10-2010-0090070 | A | 8/2010 |
| KR | 10-2010-0099806 | A | 9/2010 |
| KR | 10-2010-0119368 | A | 11/2010 |
| KR | 10-2010-0126125 | A | 12/2010 |
| KR | 10-2010-0128589 | A | 12/2010 |
| KR | 10-2010-0130786 | A | 12/2010 |
| KR | 10-2010-0133678 | A | 12/2010 |
| KR | 10-2010-0138139 | A | 12/2010 |
| KR | 10-1017654 | B1 | 2/2011 |
| KR | 10-2011-0021090 | A | 3/2011 |
| KR | 10-2011-0022512 | A | 3/2011 |
| KR | 10-2011-0032589 | A | 3/2011 |
| KR | 10-2011-0082418 | A | 7/2011 |
| KR | 10-2011-0110525 | A | 10/2011 |
| KR | 10-2011-0120213 | A | 11/2011 |
| KR | 10-2011-0138787 | A | 12/2011 |
| KR | 10-2012-0006324 | A | 1/2012 |
| KR | 10-2012-00063222 | A | 1/2012 |
| KR | 10-2012-0012300 | | 2/2012 |
| KR | 10-2012-0042155 | A | 5/2012 |
| KR | 10-2012-0065789 | A | 6/2012 |
| KR | 10-2012-0080855 | A | 7/2012 |
| KR | 10-2012-0081811 | A | 7/2012 |
| KR | 10-1193186 | B1 | 10/2012 |
| KR | 10-2012-0131545 | A | 12/2012 |
| KR | 10-2013-0007308 | A | 1/2013 |
| WO | WO99/25894 | | 5/1999 |
| WO | 03043067 | A1 | 5/2003 |
| WO | WO2004016406 | A1 | 2/2004 |
| WO | 2008004792 | A1 | 1/2008 |

OTHER PUBLICATIONS

Patent Abstracts of Japan, and English machine translation of Japanese Publication 2003-003250, 25 pages.

Korean Patent Abstracts, Publication No. 1020020086047, dated Nov. 18, 2002, for corresponding Korean Patent 10-0405080 listed above.

Korean Patent Abstracts, Publication No. 1020020088662, dated Nov. 29, 2002, for corresponding Korean Patent 10-0463212 listed above.

Korean Patent Abstracts, Publication No. 1020050045619, dated May 17, 2005, for corresponding Korean Patent 10-0520159 listed above.

Korean Patent Abstracts, Publication No. 1020040062203, dated Jul. 7, 2004, for corresponding Korean Patent 10-0646160 listed above.

Korean Patent Abstracts, Publication No. 1020060101987, dated Sep. 27, 2006, for corresponding Korean Patent 10-0687007 listed above.

Korean Patent Abstracts, Publication No. 1020020056238, dated Jul. 10, 2002, for corresponding Korean Patent 10-0698033 listed above.

Korean Patent Abstracts, Publication No. 1020050078637, dated Aug. 5, 2005, for corresponding Korean Patent 10-0700466 listed above.

Korean Patent Abstracts, Publication No. 1020070025164, dated Mar. 8, 2007, for corresponding Korean Patent 10-0711885 listed above.

(56) References Cited

OTHER PUBLICATIONS

Korean Patent Abstracts, Publication No. 1020020034272, dated May 9, 2002, for corresponding Korean Patent 10-0726132 listed above.
Korean Patent Abstracts, Publication No. 1020060126267, dated Dec. 7, 2006, for corresponding Korean Patent 10-0797787 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.
Korean Patent Abstracts, Publication No. 1020070050793, dated May 16, 2007, for corresponding Korean Patent 10-0815265 listed above.
Korean Patent Abstracts, Publication No. 102000-0019254 dated Apr. 6, 2000, for corresponding Korean Patent No. 10-2007-0101842 listed above.
English Abstract, Publication No. KR20080002189 dated Jan. 4, 2008, for corresponding Korean Patent 10-0800125 listed above.
Korean Notice of Allowance dated Nov. 25, 2011 for Korean Patent Application No. 10-2010-0014277, 5 pages.
Korean Notice of Allowance dated Sep. 28, 2011 for Korean Patent Application No. 10-2009-0042357, 5 pages.
Korean Notice of Allowance dated Jan. 13, 2012 for Korean Patent Application No. 10-2009-0056529, 5 pages.
Korean Office action dated Feb. 1, 2012 for Korean Application No. 10-2010-0011196, 4 pages.
Korean Office action dated Feb. 1, 2012 for Korean Application No. 10-2010-0013848, 3 pages.
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 20, 2015 for corresponding Japanese Patent application 2011-118686 (5 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Aug. 24, 2012, issued to KR 10-2010-0066993 (5 pages).
KIPO Notice of Allowance dated Jul. 20, 2012, issued to KR 10-2010-0003545 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, ( 5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Sep. 1, 2012, issued to KR 10-2010-0014276 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28,2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 201010266406.6, (36 pages).
SIPO Certificate of Patent dated Jul. 31, 2013, corresponding to Chinese Patent application 201110029291.3, (31 pages).
SIPO Office action dated Apr. 3, 2015, corresponding to Chinese Patent application 201210008397.X, (7 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Feb. 2, 2015, for corresponding Chinese Patent application 201110199594.X (12 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).

(56) References Cited

OTHER PUBLICATIONS

SIPO Office Action dated Oct. 9, 2012 for Chinese Application No. 201010266406.6 (6 pages.).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages.).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).
U.S. Notice of Allowance dated Jun. 30, 2014, issued to U.S. Appl. No. 12/907,396 (40 pages).
U.S. Notice of Allowance dated May 9, 2014 for U.S. Appl. No. 13/194,759 (27 pages).
U.S. Notice of Allowance dated Oct. 28, 2014, issued to U.S. Appl. No. 13/014,225 (64 pages).
U.S. Office action dated Apr. 1, 2013, issued to U.S. Appl. No. 12/784,774 (44 pages).
U.S. Office action dated Apr. 18, 2014, issued to U.S. Appl. No. 12/804,816 (9 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 17,2012, issued to U.S. Appl. No. 12/873,556 (37 pages).
U.S. Office action dated Dec. 2, 2013, issued to U.S. Appl. No. 13/157,220 (33 pages).
U.S. Office action dated Dec. 26, 2012, issued to U.S. Appl. No. 12/815,673 (21 pages).
U.S. Office action dated Dec. 31, 2014 issued to U.S. Appl. No. 12/873,556, (72 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office action dated Jun. 17, 2014, issued to U.S. Appl. No. 13/157,220 (36 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19,2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office action dated May 6, 2014, issued to U.S. Appl. No. 13/467,998 (21 pages).
U.S. Office Action dated May 7, 2013, issued in U.S. Appl. No. 12/820,270 (37 pages).
U.S. Office action dated Nov. 14, 2014, issued to U.S. Appl. No. 13/178,472 (10 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2012 for No. U.S. Appl. No. 12/869,830 (28 pages).
U.S. Office action dated Oct. 7, 2013, issued to U.S. Appl. No. 13/279,077, (29 pages).
U.S. Office action dated Sep. 25, 2013, for U.S. Appl. No. 13/031,756, (34 pages).
U.S. Office action dated Sep. 26, 2014, issued to U.S. Appl. No. 12/868,099 (66 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20pages).
US Office action dated Sep. 12, 2012, in U.S. Appl. No. 12/815,673 (26 pages).

* cited by examiner

ORGANIC LAYER DEPOSITION APPARATUS AND METHOD OF MANUFACTURING ORGANIC LIGHT-EMITTING DISPLAY APPARATUS BY USING THE SAME

CROSS-REFERENCE TO RELATED APPLICATION

This application claims priority to and the benefit of Korean Patent Application No. 10-2011-0049794, filed on May 25, 2011 in the Korean Intellectual Property Office, the entire content of which is incorporated herein by reference.

BACKGROUND

1. Field

Aspects of embodiments of the present invention relate to an organic layer deposition apparatus and a method of manufacturing an organic light-emitting display apparatus by using the same.

2. Description of the Related Art

Organic light-emitting display apparatuses typically have a larger viewing angle, better contrast characteristics, and a faster response rate than other display apparatuses, and thus have drawn attention as a next-generation display apparatus.

Organic light-emitting display apparatuses generally have a stacked structure including an anode, a cathode, and an emission layer interposed between the anode and the cathode. The apparatuses display images in color when holes and electrons, injected respectively from the anode and the cathode, recombine in the emission layer and emit light. However, it is difficult to achieve high light-emission efficiency with such a structure, and thus intermediate layers, including an electron injection layer, an electron transport layer, a hole transport layer, a hole injection layer, etc., may be optionally additionally interposed between the emission layer and each of the electrodes.

However, it is very difficult to form fine patterns of an organic thin layer such as an organic light emitting layer or an organic intermediate layer, and red, green, and blue luminous efficiency varies according to the organic thin layer. Thus, it is very difficult to pattern the organic thin layer in a large area by using a conventional organic layer deposition apparatus, and a large-sized organic light-emitting display apparatus having satisfactory driving voltage, current density, brightness, color purity, luminous efficiency and life-span may not be manufactured.

The above information disclosed in this Background section is only for enhancement of understanding of the background of the described technology and, therefore, it may contain information that does not form the prior art that is already known in this country to a person of ordinary skill in the art.

SUMMARY

According to aspects of embodiments of the present invention, an organic layer deposition apparatus may be easily manufactured, may be simply applied to manufacture large-sized display apparatuses on a mass scale and improves manufacturing yield and deposition efficiency. According to another aspect of embodiments of the present invention, a method of manufacturing an organic light-emitting display apparatus uses the organic layer deposition apparatus. According to another aspect of embodiments of the present invention, an organic light-emitting display apparatus may be manufactured on a mass scale and having improved manufacturing yield and deposition efficiency using the organic layer deposition apparatus according to embodiments of the present invention.

According to an embodiment of the present invention, an organic layer deposition apparatus for forming an organic layer on a substrate includes: a deposition source configured to discharge a deposition material; a deposition source nozzle unit arranged at a side of the deposition source and including a plurality of deposition source nozzles; a patterning slit sheet facing the deposition source nozzle unit and including a plurality of patterning slits, the patterning slit sheet being smaller than the substrate in at least one of a first direction or a second direction perpendicular to the first direction; a blocking member configured to be disposed between the substrate and the deposition source to block at least a portion of the substrate; and a heating member on the blocking member and configured to heat the blocking member, and the substrate is spaced apart from the organic layer deposition apparatus by a predetermined distance, and at least one of the substrate or the organic layer deposition apparatus is movable relative to the other.

The blocking member may be shaped as an open mask.

The blocking member may be fixed on the deposition source.

The blocking member may be configured to block a non-layer-formation region of the substrate.

The blocking member may include a blocking member frame having a hollow window frame and an open mask sheet being thin and disposed inside the blocking member frame.

The blocking member frame and the open mask sheet may be integrally formed as one body.

The heating member may be accommodated in the blocking member frame.

The heating member may heat the blocking member frame and may transfer heat applied to the blocking member frame to the open mask sheet.

The heating member may be configured to heat the blocking member such that the deposition material is not deposited on the blocking member.

The heating member may be configured to heat the blocking member at a greater temperature than a temperature at which the deposition material is vaporized.

The heating member may include a coil heater or a thin layer heater.

The patterning slit sheet of the organic layer deposition apparatus may be formed to be smaller than the substrate.

Deposition source nozzles of the plurality of deposition source nozzles may be arranged in the first direction, and patterning slits of the plurality of patterning slits may be arranged in the second direction.

The deposition source and the deposition source nozzle unit may be connected to the patterning slit sheet by a connection member.

The connection member may form a flow path of the deposition material.

The connection member may seal a space between the deposition source nozzle unit and the patterning slit sheet.

Deposition source nozzles of the plurality of deposition source nozzles may be tilted at a predetermined angle.

The plurality of deposition source nozzles may include deposition source nozzles arranged in two rows extending in the first direction, and the deposition source nozzles in the two rows may be tilted toward each other.

The plurality of deposition source nozzles may include deposition source nozzles arranged in two rows extending in the first direction, and the deposition source nozzles of a row located at a first side of the patterning slit sheet may be arranged to face a second side of the patterning slit sheet, and the deposition source nozzles of the other row located at the second side of the patterning slit sheet may be arranged to face the first side of the patterning slit sheet.

Deposition source nozzles of the plurality of deposition source nozzles are arranged in the first direction, and patterning slits of the plurality of patterning slits are arranged in the first direction, and the organic layer deposition apparatus may further include a barrier plate assembly including a plurality of barrier plates arranged between the deposition source nozzle unit and the patterning slit sheet in the first direction and partitioning a space between the deposition source nozzle unit and the patterning slit sheet into a plurality of sub-deposition spaces.

Barrier plates of the plurality of barrier plates may extend in the second direction.

The barrier plate assembly may include a first barrier plate assembly including a plurality of first barrier plates, and a second barrier plate assembly including a plurality of second barrier plates.

Each of the plurality of first barrier plates and each of the second barrier plates may extend in the second direction and partition the space between the deposition source nozzle unit and the patterning slit sheet into the plurality of sub-deposition spaces.

The apparatus may further include a chamber, deposition source nozzles of the plurality of deposition source nozzles may be arranged in the first direction, the patterning slit sheet may be bound inside the chamber, and patterning slits of the plurality of patterning slits may be arranged in the second direction.

The apparatus may further include a first conveyor unit configured to move an electrostatic chuck on which the substrate is disposed along the first direction.

The first conveyor unit may include: a frame in which the deposition source is accommodated; and a sheet supporting member protruding from an inside of the frame and supporting the patterning slit sheet.

The apparatus may further include: a loading unit configured to fix the substrate to the electrostatic chuck; and an unloading unit configured to separate the substrate on which the deposition material has been deposited from the electrostatic chuck.

According to another embodiment of the present invention, a method of manufacturing an organic light-emitting display apparatus using an organic layer deposition apparatus including a deposition source, a deposition source nozzle unit arranged at a side of the deposition source and including a plurality of deposition source nozzles, a patterning slit sheet facing the deposition source nozzle unit and including a plurality of patterning slits, a blocking member, and a heating member on the blocking member includes: spacing a substrate which constitutes a target on which the deposition material is to be deposited apart from the organic layer deposition apparatus by a predetermined distance, the blocking member being between the substrate and the deposition source and blocking at least a portion of the substrate, the patterning slit sheet being smaller than the substrate in at least one of a first direction or a second direction perpendicular to the first direction; heating the blocking member using the heating member; discharging a deposition material from the organic layer deposition apparatus; depositing the deposition material onto the substrate while moving at least one of the organic layer deposition apparatus or the substrate relative to the other.

The blocking member may be shaped as an open mask.

The blocking member may be fixed on the deposition source.

The blocking member may block a non-layer-formation region of the substrate.

The blocking member may include a blocking member frame having a hollow window frame and an open mask sheet being thin and disposed inside the blocking member frame.

The blocking member frame and the open mask sheet may be integrally formed as one body.

The heating member may be accommodated in the blocking member frame.

The blocking member frame may be heated using the heating member, and heat applied to the blocking member frame may be transferred to the open mask sheet.

Heating the blocking member may include heating the blocking member such that the deposition material is not deposited on the blocking member.

Heating the blocking member may include heating the blocking member at a greater temperature than a temperature at which the deposition material is vaporized.

In one embodiment, the heating member may include a coil heater or a thin layer heater.

The patterning slit sheet of the organic layer deposition apparatus may be formed to be smaller than the substrate.

Deposition source nozzles of the plurality of deposition source nozzles may be arranged in the first direction, and patterning slits of the plurality of patterning slits may be arranged in the second direction.

Deposition source nozzles of the plurality of deposition source nozzles may be arranged in the first direction, and patterning slits of the plurality of patterning slits may be arranged in the first direction, and the organic layer deposition apparatus may further include a barrier plate assembly including a plurality of barrier plates arranged between the deposition source nozzle unit and the patterning slit sheet in the first direction and partitioning a space between the deposition source nozzle unit and the patterning slit sheet into a plurality of sub-deposition spaces.

The organic layer deposition apparatus may further include a chamber, and the patterning slit sheet may be bound inside the chamber, and deposition source nozzles of the plurality of deposition source nozzles may be arranged in the first direction, and patterning slits of the plurality of patterning slits may be arranged in the second direction.

According to another embodiment of the present invention, an organic light-emitting display apparatus is manufactured using the above-described organic layer deposition apparatus.

BRIEF DESCRIPTION OF THE DRAWINGS

The above and other features and advantages of the present invention will become more apparent by describing in further detail some exemplary embodiments thereof with reference to the attached drawings in which.

DETAILED DESCRIPTION

Some exemplary embodiments of the present invention will be described more fully hereinafter with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention.

Figure 1:
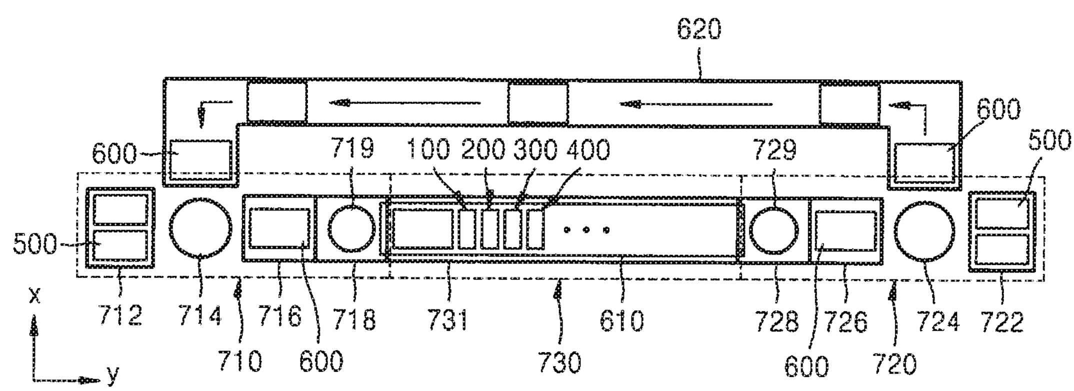
FIG. 1 is a schematic diagram of an organic layer deposition apparatus according to an embodiment of the present invention.

FIG. 1 is a schematic diagram of an organic layer deposition apparatus according to an embodiment of the present invention.

Referring to FIG. 1, the organic layer deposition apparatus according to an embodiment of the present invention includes a loading unit 710, a deposition unit 730, an unloading unit 720, a first conveyor unit 610, and a second conveyor unit 620.

The loading unit 710, in one embodiment, includes a first rack 712, a transport robot 714, a transport chamber 716, and a first inversion chamber 718.

A plurality of substrates 500 on which a deposition material has not been applied are stacked on the first rack 712. The transport robot 714 picks up a substrate 500 from the first rack 712, disposes it on an electrostatic chuck 600 transferred by the second conveyor unit 620, and moves the electrostatic chuck 600 on which the substrate 500 is disposed into the transport chamber 716.

The first inversion chamber 718 is disposed adjacent to the transport chamber 716. A first inversion robot 719 disposed in the first inversion chamber 718 inverts the electrostatic chuck 600 and then loads it into the first conveyor unit 610 of the deposition unit 730.

Figure 2:
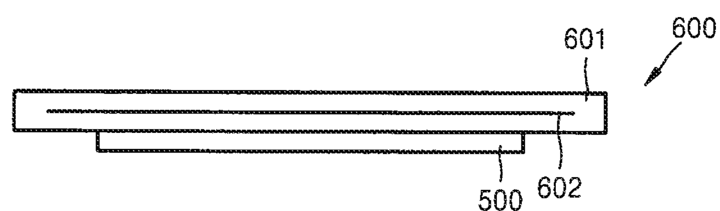
FIG. 2 is a schematic side view of an electrostatic chuck of the organic layer deposition apparatus of FIG. 1, according to an embodiment of the present invention.

Referring to FIG. 2, the electrostatic chuck 600 may include an electrode 602 embedded in a main body 601 formed of ceramic, wherein the electrode 602 is supplied with power. The electrostatic chuck 600 may fix the substrate 500 on a surface of the main body 601 as a voltage (e.g., a high voltage) is applied to the electrode 602.

Referring to FIG. 1, the transport robot 714 places one of the substrates 500 on a top surface of the electrostatic chuck 600, and the electrostatic chuck 600 on which the substrate 500 is disposed is loaded into the transport chamber 716. The first inversion robot 719 inverts the electrostatic chuck 600 such that the substrate 500 is turned upside down in the deposition unit 730.

The unloading unit 720, in one embodiment, is configured to operate in an opposite manner to the loading unit 710 described above. In one embodiment, a second inversion robot 729 in a second inversion chamber 728 inverts the electrostatic chuck 600, which has passed through the deposition unit 730 while the substrate 500 is disposed on the electrostatic chuck 600, and then moves the electrostatic chuck 600 on which the substrate 500 is disposed into an ejection chamber 726. Then, an ejection robot 724 removes the electrostatic chuck 600 on which the substrate 500 is disposed from the ejection chamber 726, separates the substrate 500 from the electrostatic chuck 600, and then loads the substrate 500 into a second rack 722. The electrostatic chuck 600 separated from the substrate 500 is returned to the loading unit 710 via the second conveyor unit 620.

However, aspects of the present invention are not limited to the above description. For example, in one embodiment, when disposing the substrate 500 on the electrostatic chuck 600, the substrate 500 may be fixed onto a bottom surface of the electrostatic chuck 600 and then moved into the deposition unit 730. In such an embodiment, for example, the first inversion chamber 718, the first inversion robot 719, the second inversion chamber 728, and the second inversion robot 729 may be omitted.

The deposition unit 730 may include at least one deposition chamber. In one embodiment, as illustrated in FIG. 1 the deposition unit 730 may include a chamber 731 in which first to fourth organic layer deposition assemblies 100, 200, 300, and 400 may be disposed.

However, although FIG. 1 depicts four organic layer deposition assemblies, i.e. the first to fourth organic layer deposition assemblies 100, 200, 300, and 400 installed in the chamber 731, the total number of organic layer deposition assemblies that may be installed in the chamber 731 may be varied in other embodiments, such as according to a deposition material and deposition conditions. The chamber 731, in one embodiment, is maintained in a vacuum state during a deposition process.

In the embodiment illustrated in FIG. 1, the electrostatic chuck 600 on which the substrate 500 is disposed may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 3:
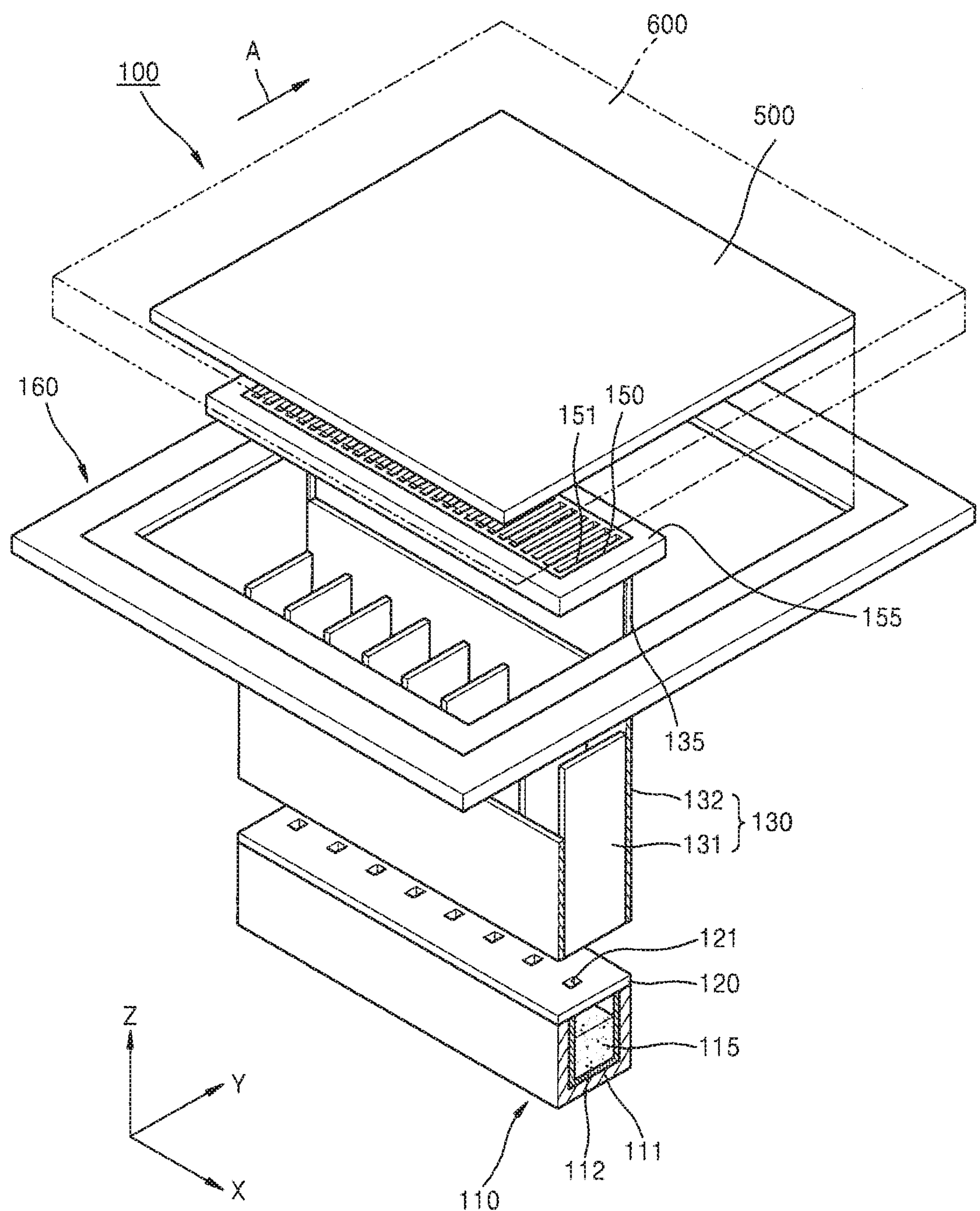
FIG. 3 is a schematic perspective view of an organic layer deposition assembly of the organic layer deposition apparatus of FIG. 1, according to an embodiment of the present invention.
Figure 4:
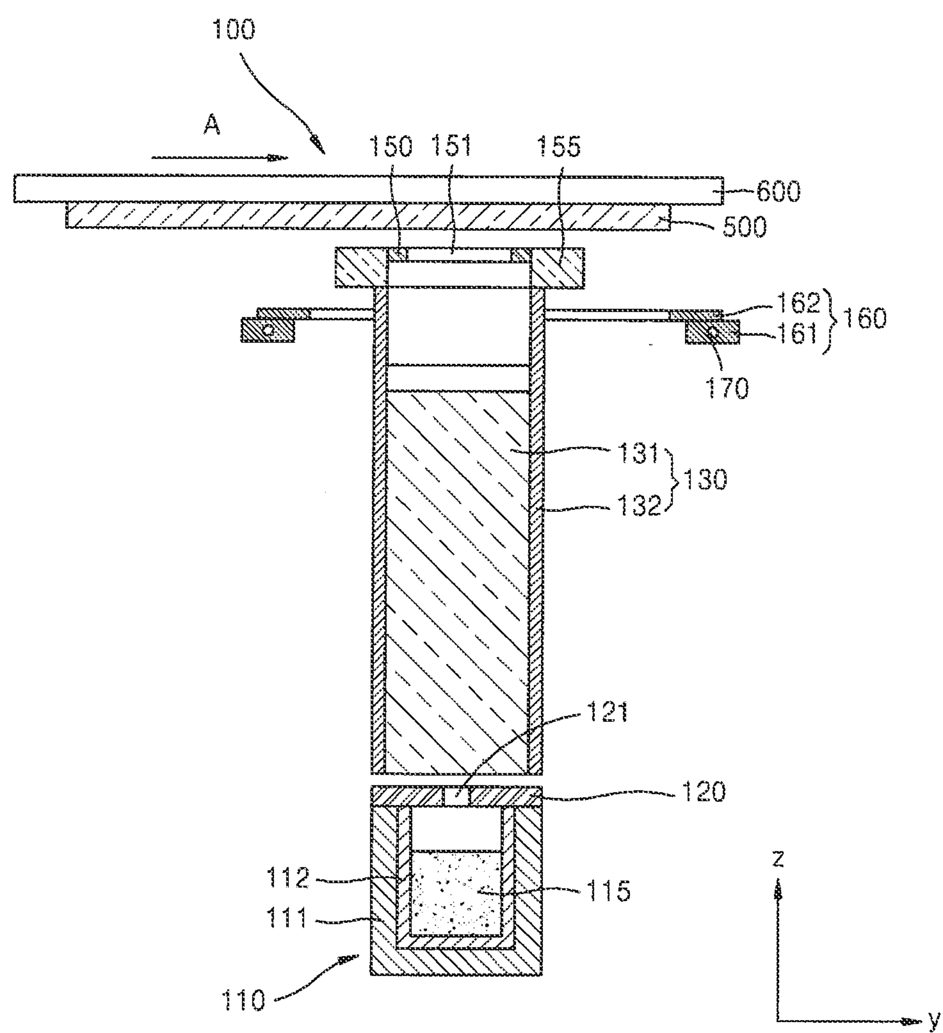
FIG. 4 is a schematic side sectional view of the organic layer deposition assembly of FIG. 3.

The organic layer deposition assembly 100 of the organic layer deposition apparatus, according to an embodiment of the present invention, will now be described. FIG. 3 is a schematic perspective view of the organic layer deposition assembly 100 of the organic layer deposition apparatus of FIG. 1, according to an embodiment of the present invention; FIG. 4 is a schematic side sectional view of the organic layer deposition assembly 100; and FIG. 5 is a schematic front sectional view of the organic layer deposition assembly 100.

Figure 5:
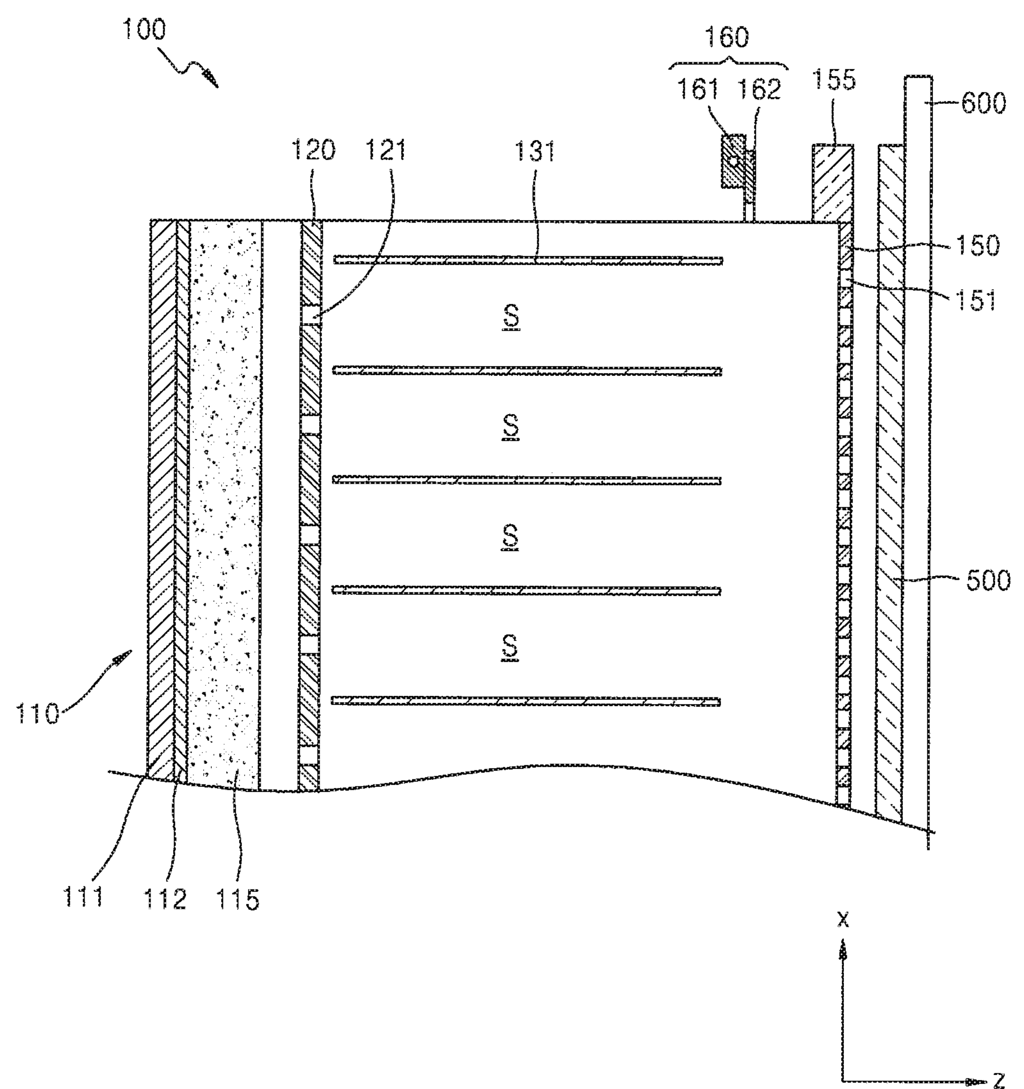
FIG. 5 is a schematic front sectional view of the organic layer deposition assembly of FIG. 3.

Referring to FIGS. 3 through 5, the organic layer deposition assembly 100 according to an embodiment of the present invention includes a deposition source 110, a deposition source nozzle unit 120, a barrier plate assembly 130, a patterning slit sheet 150, a blocking member 160, and a heating member 170.

Although a chamber is not illustrated in FIGS. 3 through 5 for purposes of illustration, the components of the organic layer deposition assembly 100 may be disposed within a chamber that is maintained at an appropriate degree of vacuum. The chamber may be maintained at an appropriate vacuum in order to allow a deposition material to move in a substantially straight line through the organic layer deposition assembly 100.

In the chamber 731 (see FIG. 1) in which the organic layer deposition assembly 100 is disposed, the substrate 500, which constitutes a deposition target on which a deposition material 115 is to be deposited, is transferred by the electrostatic chuck 600. The substrate 500 may be a substrate for flat panel displays. A large substrate, such as a mother glass for manufacturing a plurality of flat panel displays, may be used as the substrate 500. Other substrates may also be used.

In an embodiment of the present invention, the substrate 500 or the organic layer deposition assembly 100 may be moved relative to the other. For example, as illustrated in FIGS. 3 and 4, the substrate 500 may be moved in a direction of arrow "A" relative to the organic layer deposition assembly 100.

In a conventional deposition method using a fine metal mask (FMM), the size of the FMM has to be greater than or equal to the size of a substrate. Thus, the size of the FMM has to be increased as the substrate becomes larger. However, it is neither straightforward to manufacture a large FMM nor to extend an FMM to be accurately aligned with a pattern.

The above-described problem is overcome in the organic layer deposition assembly 100 according to an embodiment of the present invention, as deposition may be performed while the organic layer deposition assembly 100 or the substrate 500 is moved relative to the other. In other words, in one embodiment, deposition may be continuously performed while the substrate 500, which is disposed such as to face the organic layer deposition assembly 100, is moved in a Y-axis direction (i.e. in the direction of the arrow "A"). That is, deposition may be performed in a scanning manner while the substrate 500 is moved in the direction of arrow "A" in FIGS. 3 and 4. Although the substrate 500 is illustrated as being moved within the chamber (see 731 of FIG. 1) in the Y-axis direction when deposition is performed, the present invention is not limited thereto. For example, in another embodiment, deposition may be performed while the organic layer deposition assembly 100 is moved in the Y-axis direction, while the substrate 500 is fixed.

In the organic layer deposition assembly 100 according to an embodiment of the present invention, the patterning slit sheet 150 may be significantly smaller than a FMM used in a conventional deposition method. In the organic layer deposition apparatus 100, deposition may be continuously performed, such as in a scanning manner, while the substrate 500 is moved in the Y-axis direction. Thus, a length of the patterning slit sheet 150 in the Y-axis direction may be less (e.g., significantly less) than a length of the substrate 500, and a width of the patterning slit sheet 150 in the X-axis direction and a width of the substrate 500 in the X-axis direction may be substantially equal to each other. However, in another embodiment, the width of the patterning slit sheet 150 in the X-axis direction may be less than the width of the substrate 500 in the X-axis direction, and deposition may be performed on the entire substrate 500 in a scanning manner while the substrate 500 or the organic layer deposition assembly 100 is moved relative to the other.

As described above, since the patterning slit sheet 150 may be formed to be significantly smaller than a FMM used in a conventional deposition method, it is relatively easy to manufacture the patterning slit sheet 150 of the present invention. As such, using the patterning slit sheet 150, which is smaller than a FMM used in a conventional deposition method, is more convenient in many or all processes, including etching and other subsequent processes, such as precise extension, welding, moving, and cleaning processes, compared to the conventional deposition method using the larger FMM. Therefore, embodiments of the present invention are advantageous for manufacturing of a relatively large display apparatus.

In order to perform deposition while the organic layer deposition assembly 100 or the substrate 500 is moved relative to the other as described above, the organic layer deposition assembly 100 and the substrate 500 may be separated from each other by a predetermined distance. This is described in further detail later herein.

The deposition source 110 that contains and heats the deposition material 115 is disposed at a side of the chamber opposite to a side in which the substrate 500 is disposed.

The deposition source 110, in one embodiment, includes a crucible 112 that is filled with the deposition material 115, and a cooling block 111 surrounding the crucible 112. The cooling block 111 prevents or substantially prevents radiation of heat from the crucible 112 to the outside (i.e. into the chamber 731). The cooling block 111 may include a heater (not shown) that heats the crucible 112.

The deposition source nozzle unit 120, in one embodiment, is disposed at a side of the deposition source 110 facing the substrate 500. The deposition source nozzle unit 120, in one embodiment, includes a plurality of deposition source nozzles 121 arranged at intervals (e.g. equal intervals) in the X-axis direction. The deposition material 115 that is vaporized in the deposition source 110 passes through the deposition source nozzles 121 of the deposition source nozzle unit 120 toward the substrate 500, which constitutes a target on which the deposition material 115 is to be deposited.

In one embodiment, the barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131, in one embodiment, may be arranged parallel to each other at intervals (e.g., equal intervals) in the X-axis direction. In one embodiment, each of the barrier plates 131 may be arranged parallel to a Y-Z plane in FIG. 4. In one embodiment, each of the barrier plates 131 may have a generally rectangular shape. The plurality of barrier plates 131 partition the space between the deposition source nozzle unit 120 and the patterning slit sheet 150 into a plurality of sub-deposition spaces S (see FIG. 5). In the organic layer deposition assembly 100 according to an embodiment of the present invention, as illustrated in FIG. 5, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In one embodiment, each of the deposition source nozzles 121 may be disposed between two adjacent barrier plates 131. In one embodiment, the deposition source nozzles 121 may be respectively located at or about the midpoint between two adjacent barrier plates 131. However, the present invention is not limited to this structure. For example, in another embodiment, a plurality of deposition source nozzles 121 may be disposed between two adjacent barrier plates 131. In this case, the deposition source nozzles 121 may be respectively located at or about the midpoint between two adjacent barrier plates 131.

In one embodiment, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and passes through patterning slits 151 of the patterning slit sheet 150 so as to be deposited on the substrate 500. That is, in one embodiment, the barrier plates 131 guide the deposition material 115 which is discharged through the deposition source nozzles 121 to move straight, and not flow in the X-axis direction.

As described above, in one embodiment, the deposition material 115 is restricted to move straight by installing the barrier plates 131, such that a smaller shadow zone may be formed on the substrate 500 compared to an assembly in which no barrier plates are installed. Thus, in one embodiment, the organic layer deposition assembly 100 and the substrate 500 may be separated from each other by a predetermined distance, as is described in further detail later herein.

The patterning slit sheet 150 and a frame 155 in which the patterning slit sheet 150 is bound are disposed between the deposition source 110 and the substrate 500. The frame 155 may be formed in a lattice shape, similar to a window frame. The patterning slit sheet 150 is bound inside the frame 155. The patterning slit sheet 150 includes a plurality of patterning slits 151 arranged, or spaced from one another, in the X-axis direction. The patterning slits 151 extend in the Y-axis direction. The deposition material 115 that has been vaporized in the deposition source 110 and passed through the deposition source nozzle 121 passes through the patterning slits 151 toward the substrate 500.

The patterning slit sheet 150 may be formed of a metal thin film. The patterning slit sheet 150, in one embodiment, is fixed to the frame 150 such that a tensile force is exerted thereon. The patterning slits 151, in one embodiment, may be formed by etching the patterning slit sheet 150 in a stripe pattern. The number of patterning slits 151, in one embodiment, may be equal to the number of deposition patterns to be formed on the substrate 500.

In one embodiment, the barrier plate assembly 130 and the patterning slit sheet 150 may be disposed to be separated from each other by a predetermined distance. Alternatively, the barrier plate assembly 130 and the patterning slit sheet 150 may be connected by a connection member 135.

The blocking member 160 is disposed between the barrier plate assembly 130 and the patterning slit sheet 150. The heating member 170 is disposed on the blocking member 160. The blocking member 160, in one embodiment, is shaped as an open mask and is fixed on the substrate 500 to prevent or substantially prevent an organic material from being deposited on a non-layer-formation region of the substrate 500 in which no layer is to be formed. The heating member 170 may be disposed inside or at a side of the blocking member 160 to heat the blocking member 160 at a temperature (e.g., a predetermined temperature). In the organic layer deposition assembly 100 according to an embodiment of the present invention, the heating member 170 is disposed on the blocking member 160 in such a way that the deposition material 115 is not deposited on the blocking member 160, and a period for replacing or cleaning the blocking member 160 is thereby increased and product yield is improved. This is described in further detail later herein.

As described above, the organic layer deposition assembly 100 according to an embodiment of the present invention performs deposition while being moved relative to the substrate 500. In order to move the organic layer deposition assembly 100 relative to the substrate 500, the patterning slit sheet 150 is separated from the substrate 500 by a predetermined distance. In addition, in order to prevent or substantially prevent the formation of a relatively large shadow zone on the substrate 500 when the patterning slit sheet 150 and the substrate 500 are separated from each other, the barrier plates 131 are arranged between the deposition source nozzle unit 120 and the patterning slit sheet 150 to direct the deposition material 115 to move in a straight direction. Thus, the size of a shadow zone that may otherwise be formed on the substrate 500 is substantially reduced.

In a conventional deposition method using a FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display apparatuses become larger. However, it is not easy to manufacture such a large mask.

In the organic layer deposition apparatus 100 according to an embodiment of the present invention, the patterning slit sheet 150 is disposed to be separated from the substrate 500 by a predetermined distance. This may be facilitated by installing the barrier plates 131 to reduce the size of the shadow zone formed on the substrate 500.

A thin layer, such as an organic layer, of an organic light-emitting display apparatus may be formed by using the organic layer deposition apparatus according to the present invention, and will be described in further detail later herein with reference to FIG. 11.

In the organic layer deposition assembly 100 according to an embodiment of the present invention, the heating member 170 is disposed on the blocking member 160 in such a way that the deposition material 115 is not deposited on the blocking member 160 and a period for replacing or cleaning the blocking member 160 is increased and product yield is improved.

Since an anode pattern or a cathode pattern may be formed on edges of the substrate 500, a region to be used as a terminal exists in the edges of the substrate 500 when a product is to be inspected or manufactured. When an organic layer is formed in the region, an anode or a cathode does not act as itself. Thus, in one embodiment, the edges of the substrate 500 are to formed as a non-layer-formation region in which no organic layer is to be formed. As described above, the organic layer deposition apparatus according to the present invention performs deposition in a scanning manner while the substrate 500 is moved relative to the organic layer deposition apparatus, and, in one embodiment, an organic material is to be prevented or substantially prevented from being deposited on the non-layer-formation region of the substrate 500.

In order to prevent or substantially prevent the organic material from being deposited on the non-layer-formation region of the substrate 500, the organic layer deposition apparatus according to embodiments of the present invention include the blocking member 160 disposed so as to cover the edges of the substrate 500.

Referring to FIGS. 3 through 5, in one embodiment, the blocking member 160 that is shaped as an open mask is disposed in a lower portion of the substrate 500 (i.e. in a lower portion of a bottom surface of the substrate 500 that faces the deposition source 110), such that the blocking member 160 is fixed on the substrate 500. In this regard, the blocking member 160 may be shaped as an open mask in the form of a hollow window frame. The deposition material 115 that has been vaporized in the deposition source 110 is blocked by the blocking member 160 and is not deposited on a portion (i.e. a non-layer-formation region) of the substrate 500 that has passed through the deposition source 110.

In one embodiment, the blocking member 160 may include at least one metal selected from the group consisting of carbon (C), iron (Fe), chromium (Cr), manganese (Mn), nickel (Ni), titanium (Ti), molybdenum (Mo), stainless steel (SUS), an Invar alloy, an Inconel alloy, and a Kovar alloy. However, embodiments of the blocking member 160 according to the present invention are not limited thereto. In one embodiment, the blocking member 160 may include an Invar alloy having a lower thermal expansion coefficient than that of SUS and which may be less susceptible to becoming wrinkled. In addition, a tensile force to be applied to the Invar alloy may not be greatly reduced even at a high temperature and thus, the Invar alloy may not adversely affect the blocking member 160.

In one embodiment, the blocking member 160 may include a blocking member frame 161 and an open mask sheet 162. The blocking member 160 may include a blocking member frame 161 having a hollow window frame shape and an open mask sheet 162 which is thin and disposed inside the blocking member frame 161. The blocking member frame 161 and the open mask sheet 162 may be integrally formed as one body. In one embodiment, the blocking member frame 161 and the open mask sheet 162 are integrally formed as one body such that the blocking member frame 161 may be heated and the temperature of the open mask sheet 162 may rise.

The heating member 170 may be accommodated in the blocking member 160 or may be connected to a side of the blocking member 160 and is configured to heat the blocking member 160 at a predetermined temperature. The blocking member 170 may heat the blocking member 160 to prevent or substantially prevent the deposition material 115 from being deposited on the blocking member 160 or to remove the deposition material 115 that has already been deposited on the blocking member 160.

In one embodiment, according to a deposition process performed using the organic layer deposition apparatus according to an embodiment of the present invention, the deposition material 115 discharged through the deposition source 110 passes through the blocking member 160 and the patterning slit sheet 150 and is deposited on the substrate 500, which constitutes a deposition target on which the deposition material 115 is to be deposited, and a portion of the deposition material 115 may be deposited on the open mask sheet 162 of the blocking member 160. However, when the deposition material 115 is deposited on the open mask sheet 162 of the blocking member 160, a portion of a deposition path of the deposition material 115 may be blocked such that a desired shape of a pattern to be deposited on the substrate 500 may not be formed.

This problem is overcome according to an embodiment of the present invention in which the organic layer deposition assembly 100 includes the heating member 170 disposed on the blocking member 160, thereby preventing or substantially preventing the deposition material 115 from being deposited on the blocking member 160 or removing the deposition material 115 that has already been deposited on the blocking member 160. In one embodiment, while the deposition material 115 is deposited, the heating member 170 may heat the blocking member 160 at a temperature (e.g., a predetermined temperature) or greater, such as at a higher temperature than a temperature at which the deposition material 115 is vaporized, so as to prevent or substantially prevent the deposition material 115 from being deposited on the blocking member 160. In one embodiment, while the deposition material 115 is not being discharged through the deposition source 110, the heating member 170 may heat the blocking member 160 at a greater temperature than a temperature at which the deposition material 115 is vaporized, so as to remove the deposition material 115 that has already been deposited on the open mask sheet 162. In one embodiment, in the organic layer deposition apparatus according to an embodiment of the present invention, after the deposition material 115 is stopped from being discharged during the deposition process, the blocking member 160 is heated by the heating member 170 within the chamber (see 731 of FIG. 1), thereby vaporizing and removing the deposition material 115 deposited on the open mask sheet 162, and discharging the deposition material 115 again and depositing the deposition material 115 on the substrate 500.

Thus, since the organic layer deposition apparatus according to an embodiment of the present invention is configured to remove the deposition material 115 deposited on the blocking member 160 within the chamber (see 731 of FIG. 1), an additional cleaning process for cleaning the blocking member 160 by removing the blocking member 160 is not required such that an organic layer deposition process may be simply performed. In addition, since the deposition material 115 may be prevented or substantially prevented from being deposited on the blocking member 160 during the deposition process, the open mask sheet 162 of the blocking member 160 may be efficiently prevented from being clogged. In one embodiment, the deposition material 115 that has been vaporized by heating performed by the heating member 170 is deposited on the barrier plate assembly 130 and may be recovered and re-used such that utilization efficiency of the deposition material 115 may be improved.

In one embodiment, the heating member 170 may be inserted in the blocking member frame 161 of the blocking member 160 in a form of a coil heater, as illustrated in FIG. 4. However, the present invention is not limited thereto. For example, in another embodiment, the heating member 170 may be implemented as a thin layer heater connected to a side of the blocking member 160 and may be formed in various shapes in various positions where thermal energy (e.g., predetermined thermal energy) may be supplied to the blocking member 160.

In one embodiment, the blocking member frame 161 and the open mask sheet 162 may be integrally formed as one body. If the blocking member frame 161 and the open mask sheet 162 are formed of different materials and are combined with each other, the blocking member frame 161 may be heated and the open mask sheet 162 may be bent. In one embodiment, the blocking member frame 161 and the open mask sheet 162 are integrally formed as one body from at least one metal selected from the group consisting of carbon (C), iron (Fe), chromium (Cr), manganese (Mn), nickel (Ni), titanium (Ti), molybdenum (Mo), stainless steel (SUS), an Invar alloy, an Inconel alloy, and a Kovar alloy described above. Thus, even when only the blocking member frame 161 is heated, heat may be easily transferred to the open mask sheet 162. When the open mask sheet 162 is heated simultaneously with the blocking member frame 161, the open mask sheet 162 may be prevented or substantially prevented from being bent.

According to embodiments of the present invention, a period for cleaning and replacing the blocking member 160 is increased and the frequency at which a manufacturing process has to be stopped is reduced, and manufacturing yield is improved. Also, an occurrence of a portion of the blocking member 160 being covered by the deposition material 115 may be prevented such that uniformity of thicknesses of organic layers to be deposited on the substrate 500 may be improved.

Figure 6:
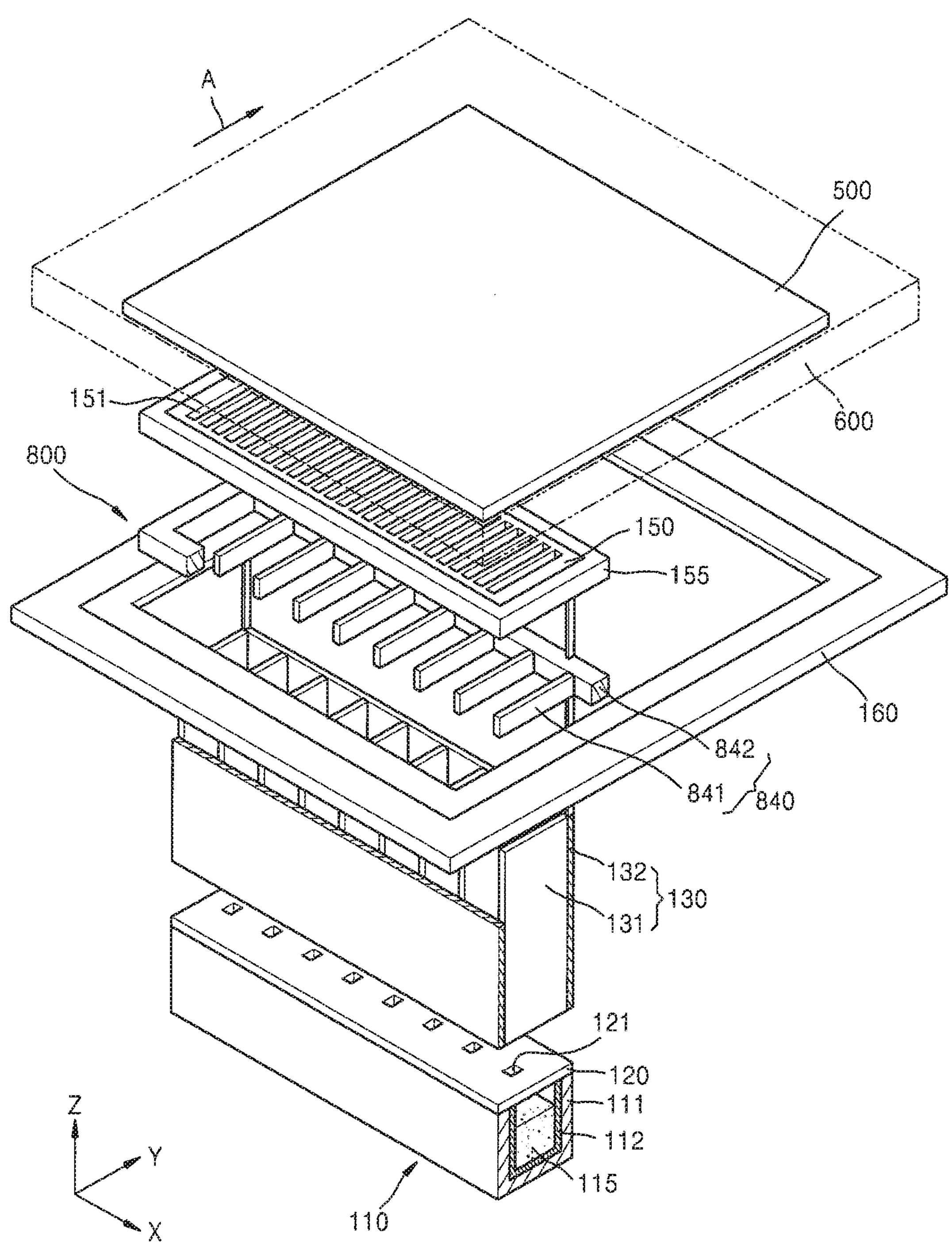
FIG. 6 is a schematic perspective view of an organic layer deposition assembly, according to another embodiment of the present invention.

FIG. 6 is a schematic perspective view of an organic layer deposition assembly 800, according to another embodiment of the present invention.

Referring to FIG. 6, the organic layer deposition assembly 800 according to another embodiment of the present invention includes the deposition source 110, the deposition source nozzle unit 120, the first barrier plate assembly 130, a second barrier plate assembly 840, the patterning slit sheet 150, the blocking member 160, and the heating member 170 (not shown). Structures of the deposition source 110, the deposition source nozzle unit 120, the first barrier plate assembly 130, the patterning slit sheet 150, the blocking member 160, and the heating member 170 may be the same as those of the organic layer deposition assembly 100 described above, and thus description thereof will not be repeated. The organic layer deposition assembly 800 differs from the organic layer deposition assembly 100 described above in that the second barrier plate assembly 840 is disposed at a side of the first barrier plate assembly 130.

In one embodiment, the second barrier plate assembly 840 includes a plurality of second barrier plates 841, and a second barrier plate frame 842 that covers sides of the second barrier plates 841. The plurality of second barrier plates 841, in one embodiment, may be arranged parallel to each other at intervals (e.g., equal intervals) in the X-axis direction. In addition, each of the second barrier plates 841 may be formed to extend in the Y-Z plane (i.e. perpendicular to the X-axis direction), as shown in FIG. 6.

The plurality of first barrier plates 131 and the second barrier plates 841 arranged as described above partition the space between the deposition source nozzle unit 120 and the patterning slit sheet 150. In one embodiment, the deposition space is divided by the first barrier plates 131 and the second barrier plates 841 into sub-deposition spaces that respectively correspond to the deposition source nozzles 121 through which the deposition material 115 is discharged.

The second barrier plates 841 may be disposed to correspond respectively to the first barrier plates 131. The second barrier plates 841 may be respectively aligned with the first barrier plates 131 to be parallel thereto on the same plane as the first barrier plates 131. Each pair of the corresponding first and second barrier plates 131 and 841 may be located on the same plane. Although the first barrier plates 131 and the second barrier plates 841 are respectively illustrated as having the same thickness in the X-axis direction, aspects of the present invention are not limited thereto. In one embodiment, the second barrier plates 841, which are aligned with the patterning slits 151, may be formed to be relatively thin, whereas the first barrier plates 131, which do not need to be as accurately aligned with the patterning slits 151, may be formed to be relatively thick. This simplifies manufacturing of the organic layer deposition assembly 800.

Figure 7:
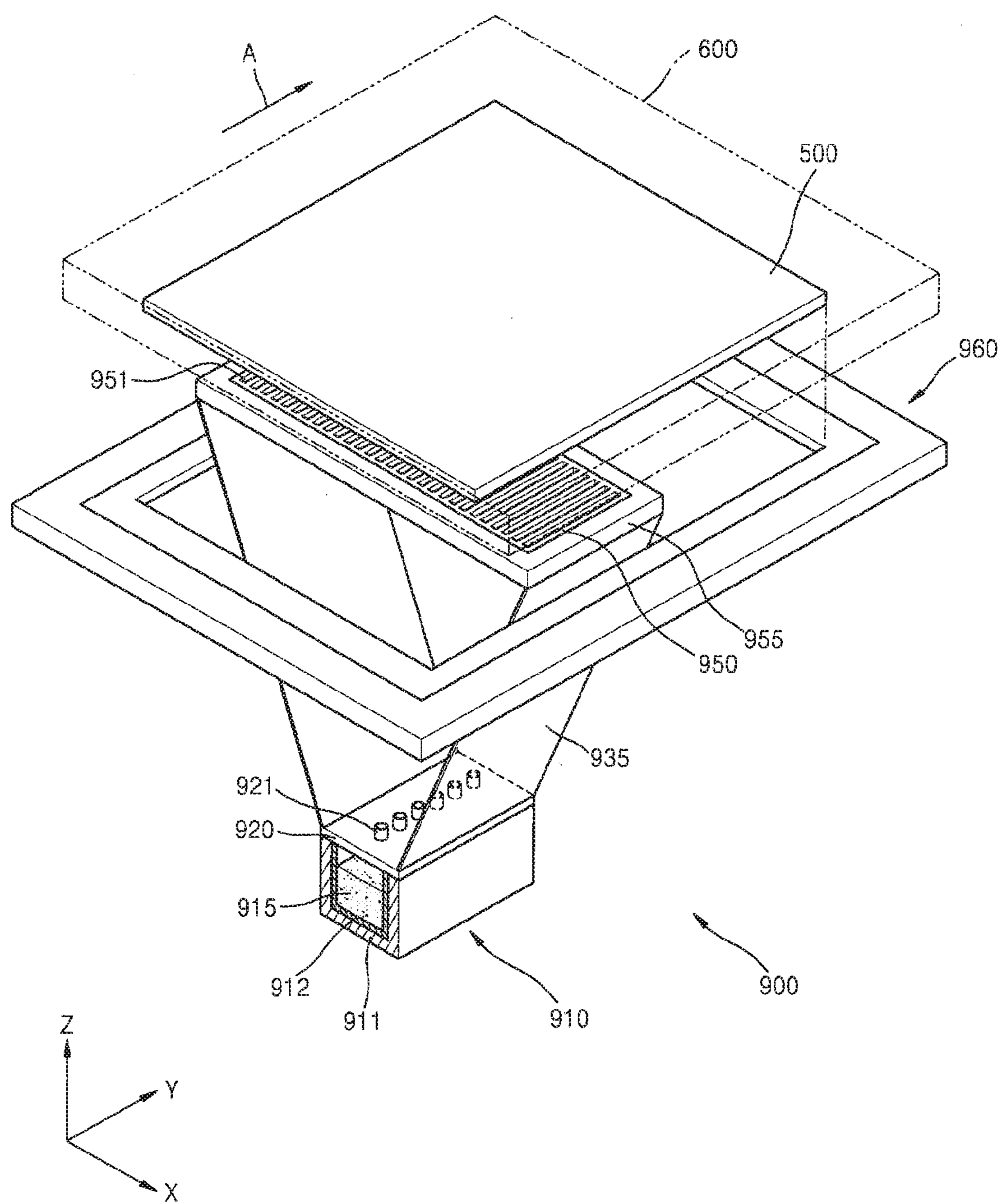
FIG. 7 is a schematic perspective view of an organic layer deposition assembly, according to another embodiment of the present invention.

FIG. 7 is a schematic perspective view of an organic layer deposition assembly 900, according to another embodiment of the present invention.

Referring to FIG. 7, the organic layer deposition assembly 900 according to another embodiment of the present invention includes a deposition source 910, a deposition source nozzle unit 920, a patterning slit sheet 950, a blocking member 960, and a heating member (not shown) in the blocking member 960.

In one embodiment, the deposition source 910 includes a crucible 911 that is filled with a deposition material 915, and a heater 912 that heats the crucible 911 to vaporize the deposition material 915 which is contained in the crucible 911, so as to move the vaporized deposition material 915 to the deposition source nozzle unit 920. The deposition source nozzle unit 920 is disposed at a side of the deposition source 910. The deposition source nozzle unit 920 includes a plurality of deposition source nozzles 921 arranged in the Y-axis direction. The patterning slit sheet 950 and a frame 955 are disposed between the deposition source 910 and the substrate 500, and the patterning slit sheet 950 includes a plurality of patterning slits 951 arranged in the X-axis direction. In one embodiment, the deposition source 910 and the deposition source nozzle unit 920 may be connected to the patterning slit sheet 950 by a connection member 935. The blocking member 960 is disposed at a side of the patterning slit sheet 950, and the heating member (not shown) is disposed inside or at a side of the blocking member 960, and may be configured the same or similar to the heating member 170 described above.

In the organic layer deposition assembly 900 according to an embodiment of the present invention, the arrangement of the plurality of deposition source nozzles 921 of the deposition source nozzle unit 920 is different from that in the above-described embodiments. This is described in further detail below.

The deposition source nozzle unit 920 is disposed at a side of the deposition source 910, and, in particular, at the side of the deposition source 910 facing the substrate 500. The deposition source nozzle unit 920 includes a plurality of deposition source nozzles 921 arranged at intervals (e.g., equal intervals) in the Y-axis direction (i.e. a scanning direction of the substrate 500). The deposition material 915 that is vaporized in the deposition source 910 passes through the deposition source nozzle unit 920 toward the substrate 500, which constitutes a target on which the deposition material 915 is to be deposited. As described above, when the deposition source nozzle unit 920 includes the plurality of deposition source nozzles 921 arranged in the Y-axis direction, that is, the scanning direction of the substrate 500, the size of a pattern formed of the deposition material 915 discharged through the patterning slits 951 of the patterning slit sheet 950 is affected by the size of one of the deposition source nozzles 921 since there is only one deposition source nozzle 921 in the X-axis direction, and thus no shadow zone may be formed on the substrate 500. In one embodiment, since the plurality of deposition source nozzles 921 are arranged in the scanning direction of the substrate 500, even if there is a difference in flux between the deposition source nozzles 921, the difference may be compensated for and deposition uniformity may be maintained constant. In the organic layer deposition assembly 900, the barrier plate assembly that is included in the organic layer deposition assembly 100 described above may be omitted, and the deposition material 915 is not deposited on the barrier plate assembly and utilization efficiency of the deposition material 915 may be improved.

Figure 8:
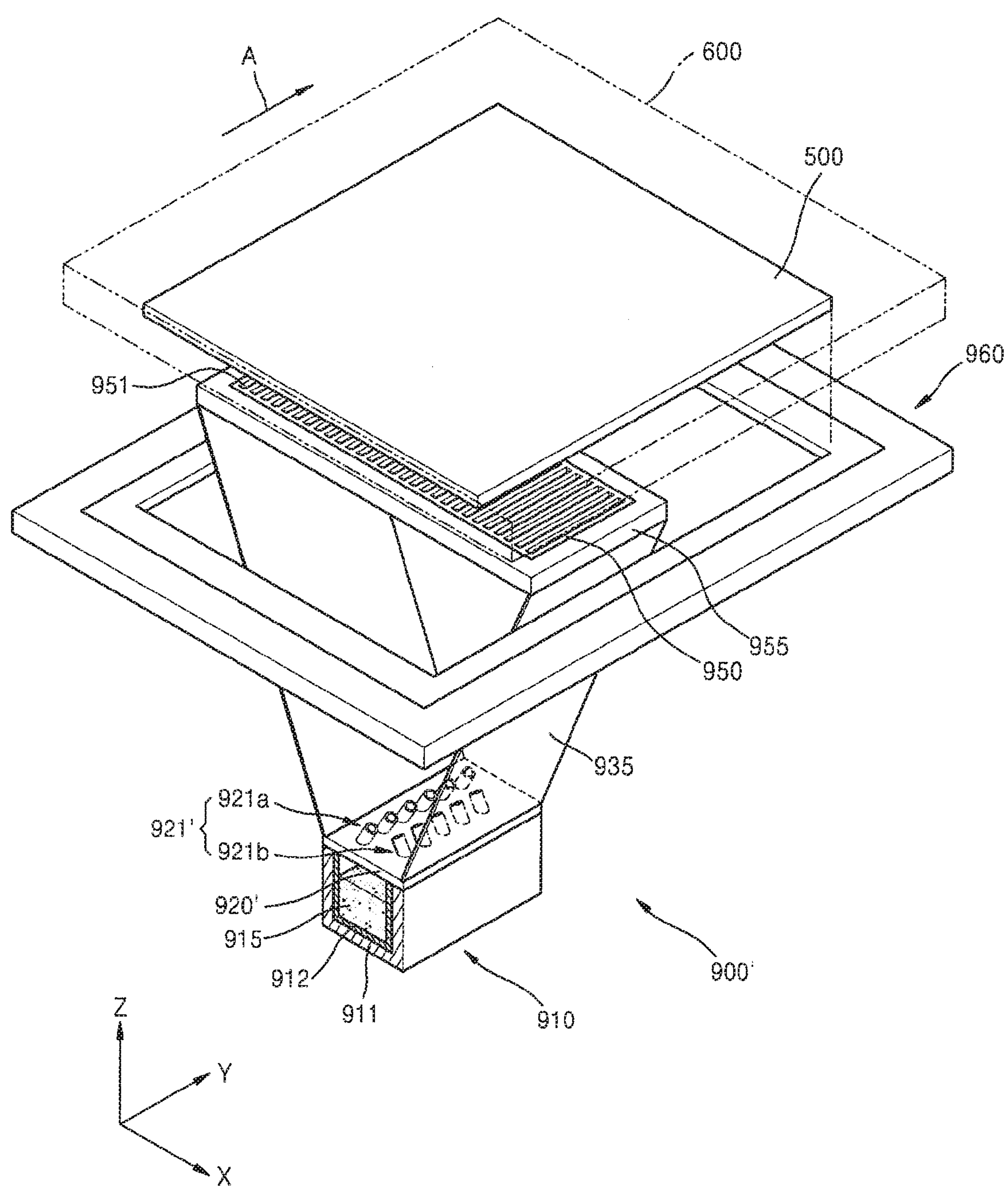
FIG. 8 is a schematic perspective view of an organic layer deposition assembly, according to another embodiment of the present invention.

FIG. 8 is a schematic perspective view of an organic layer deposition assembly 900', according to another embodiment of the present invention. Referring to FIG. 8, the organic layer deposition apparatus 900' according to an embodiment of the present invention includes the deposition source 910, a deposition source nozzle unit 920', the patterning slit sheet 950, the blocking member 960, and a heating member (not shown) in the blocking member.

In one embodiment, a plurality of deposition source nozzles 921' formed on the deposition source nozzle unit 920' are tilted at a predetermined angle, unlike in the deposition source nozzle unit 920 described above and shown in FIG. 7. In one embodiment, the deposition source nozzles 921' may include deposition source nozzles 921*a* and 921*b* arranged in respective rows. The deposition source nozzles 921*a* and 921*b* may be arranged in respective rows to alternate in a zigzag pattern. The deposition source nozzles 921*a* and 921*b* may be tilted at a predetermined angle on an XZ plane.

In one embodiment of the present invention, the deposition source nozzles 921*a* and 921*b* are arranged to be tilted at a predetermined angle relative to each other. The deposition source nozzles 921*a* in the first row and the deposition source nozzles 921*b* in the second row may be tilted toward each other. That is, in one embodiment, the deposition source nozzles 921*a* of the first row in a left part of the deposition source nozzle unit 921 are arranged to face a right side portion of the patterning slit sheet 950, and the deposition source nozzles 921*b* of the second row in a right part of the deposition source nozzle unit 921' are arranged to face a left side portion of the patterning slit sheet 950.

Due to the structure of the organic layer deposition assembly 900' according to the above-described embodiment, the amount of deposition of the deposition material 915 may be adjusted to lessen a thickness variation between the center and the end portions of the substrate 500 and improve uniformity of thicknesses of organic layers to be deposited on the substrate 500. Moreover, utilization efficiency of the deposition material 915 may also be improved.

Figure 9:
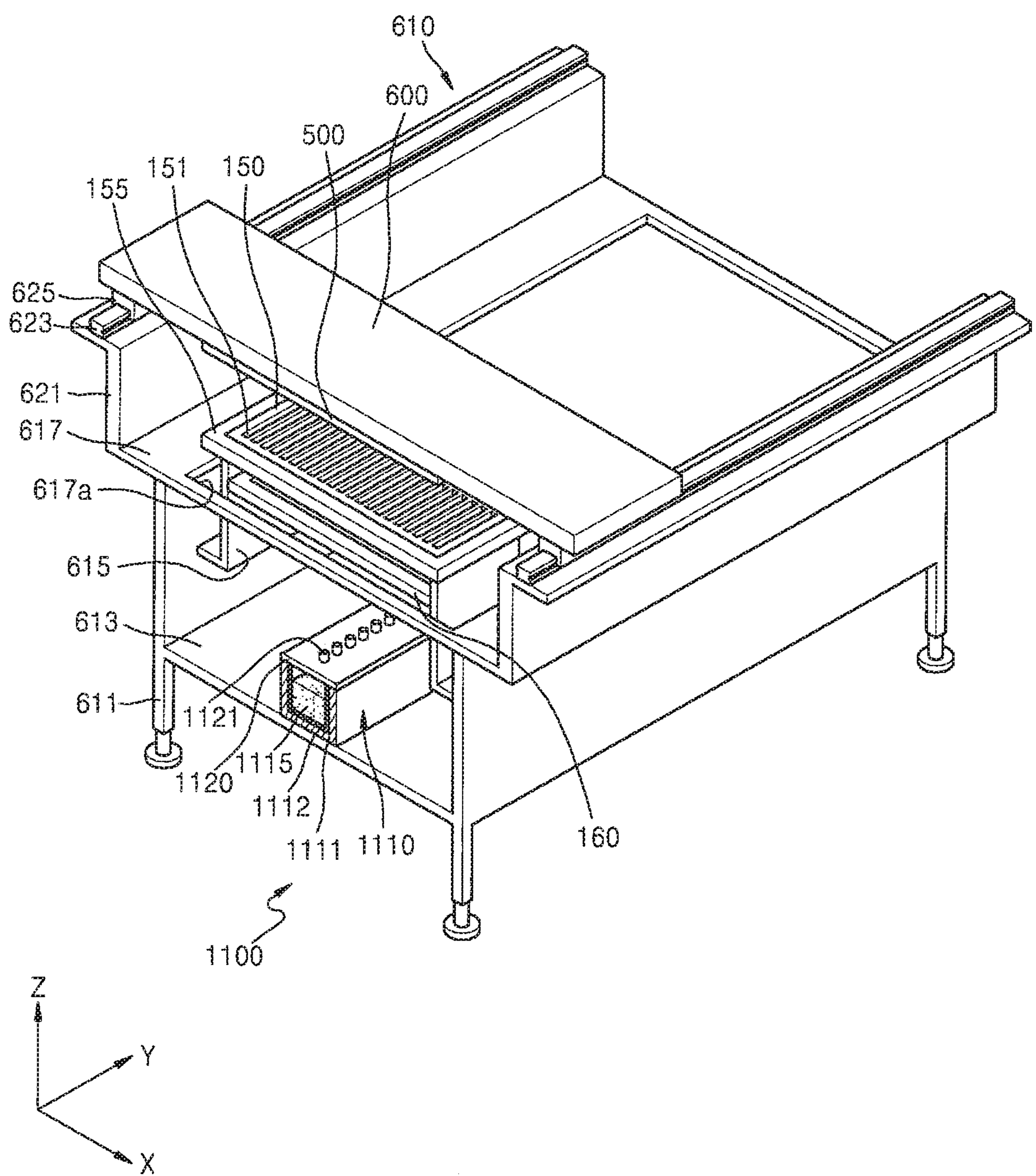
FIG. 9 is a schematic perspective view of an organic layer deposition assembly, according to another embodiment of the present invention.
Figure 10:
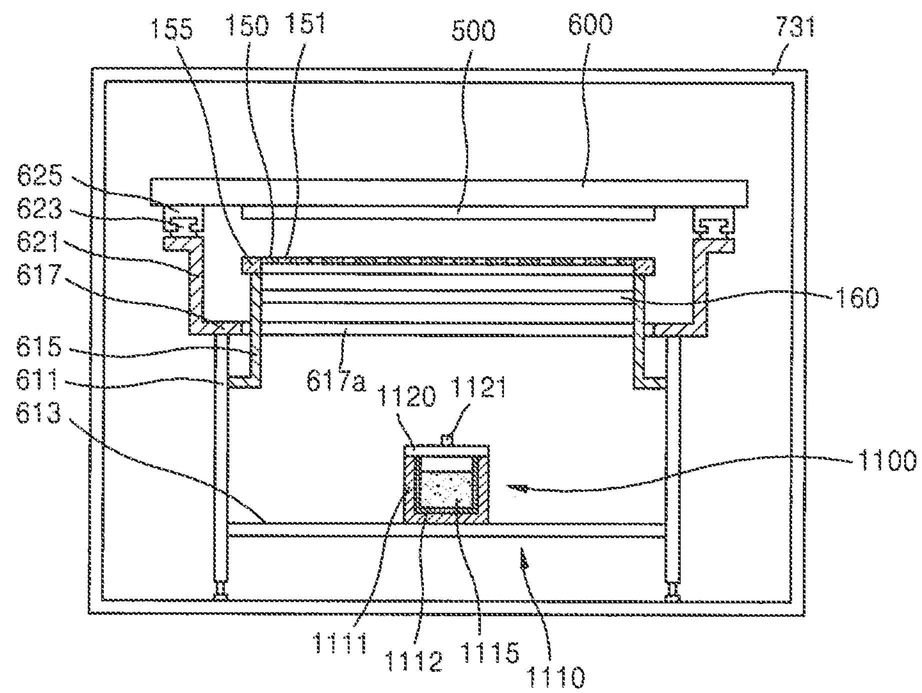
FIG. 10 is a schematic front view of the organic layer deposition assembly of FIG. 9.

FIG. 9 is a schematic perspective view of a first conveyor unit, such as the first conveyor unit 610 of the organic layer deposition apparatus of FIG. 1, and an organic layer deposition assembly 1100, according to another embodiment of the present invention, and FIG. 10 is a schematic front view of the first conveyor unit and the organic layer deposition assembly 1100 of FIG. 9. The chamber 731 of FIG. 1 is not illustrated in FIG. 9 for purposes of illustration.

Referring to FIGS. 9 through 10, the organic layer deposition apparatus 1100 according to an embodiment of the present invention includes the first conveyor unit 610 and the organic layer deposition assembly 1100 of the deposition unit 730 of FIG. 1.

The organic layer deposition assembly 1100 according to an embodiment of the present invention includes a deposition source 1110, a deposition source nozzle unit 1120, the patterning slit sheet 150, the blocking member 160, and the heating member 170 (not shown). In one embodiment, the deposition source 1110 includes a crucible 1111 that is filled with a deposition material 1115, and a heater 1112 that heats the crucible 1111 to vaporize the deposition material 1115 which is contained in the crucible 1111, so as to move the vaporized deposition material 1115 to the deposition source nozzle unit 1120. The deposition source nozzle unit 1120 is disposed at a side of the deposition source 1110. The deposition source nozzle unit 1120, in one embodiment, includes a plurality of deposition source nozzles 1121 arranged in the Y-axis direction. The patterning slit sheet 150 and the frame 155 are further disposed between the deposition source 1110 and the substrate 500. The patterning slit sheet 150 includes the plurality of patterning slits 151 arranged in the X-axis direction. In the organic layer deposition assembly 1100 according to an embodiment of the present invention, the deposition source 1110, the deposition source nozzle unit 1120, and the patterning slit sheet 150 are not integrally formed as one body, but may be formed as separate members within the deposition unit 730. This will be described in further detail later herein.

The first conveyor unit 610 is described in further detail below.

The first conveyor unit 610 moves the electrostatic chuck 600 on which the substrate 500 is disposed. In one embodiment, the first conveyor unit 610 includes a frame 611 including a lower plate 613 and an upper plate 617, a sheet supporting member 615 disposed inside the frame 611, a guide supporting member 621 disposed at a top surface of the frame 611, a pair of guide rails 623 disposed on the guide supporting member 621, and a plurality of guide blocks 625 disposed on the pair of guide rails 623.

The frame 611, in one embodiment, constitutes a base portion of the first conveyor unit 610 and has a generally hollow box shape. In one embodiment, the lower plate 613 constitutes a bottom surface of the frame 611, and the deposition source 1110 may be disposed on the lower plate 613. The upper plate 617, in one embodiment, constitutes a top surface of the frame 611, and an opening 617*a* may be formed in the upper plate 617 so as to allow the deposition material 1115 that is vaporized in the deposition source 1110 to pass through the patterning slit sheet 150 and to be deposited on the substrate 500. The elements of the frame 611 may be formed as separate members and may be subsequently connected to one another, or may be integrally formed as one body.

Although not shown, in one embodiment, the lower plate 613 on which the deposition source 1110 is disposed may be shaped as a cassette and may be removed from the frame 611. Thus, the deposition source 1110 may be easily replaced.

In one embodiment, the sheet supporting member 615 may protrude from an inside of the frame 611 and may support the patterning slit sheet 150. In one embodiment, the sheet support 615 may form or guide a flow path of the deposition material 1115 such that the deposition material 1115 discharged through the deposition source nozzles 1121 is not dispersed outside the flow path.

As described above, the deposition process is performed while the electrostatic chuck 600 on which the substrate 500 is disposed moves (e.g., moves linearly) within the chamber. In one embodiment, a device, such as a roller or a conveyor, may be used. In one embodiment, a linear motion system including the guide rail 623 and the guide block 625 may be used to transfer the substrate 500 precisely.

In one embodiment, the guide supporting member 621 disposed on the upper plate 617 and the pair of guide rails 623 disposed on the guide supporting member 621 are installed through the chamber 731 of the deposition unit 730.

A top surface of the guide supporting member 621 may be an approximately flat plane, and the pair of guide rails 623 are disposed on the top surface of the guide supporting member 621. A guide block 625 is inserted in the guide rails 623 and makes a reciprocating motion along the guide rails 623.

The guide block 625 may include a driving unit (not shown). The driving unit (not shown) allows the guide block 625 to move along the guide rails 623. The driving unit (not shown) may itself provide a driving force or may transfer a driving force from an additional driving source to the guide block 625.

In one embodiment, the guide rails 623 may be linear motion (LM) rails, and the guide block 625 may be a LM block, and the guide rails 623 and the guide block 625 may constitute a predetermined LM system. The LM system is a transfer system having a very high degree of position determination and has a relatively small coefficient of friction and small position error compared to a conventional sliding guide system. A detailed description of the LM system will not be provided herein.

As described above, according to embodiments of the present invention, a mask is formed to be smaller than a substrate, and deposition is performed while the mask is moved relative to the substrate. Thus, the mask can be easily manufactured. In addition, defects caused due to contact between a substrate and a FMM, which occurs in the conventional deposition method, may be prevented or substantially prevented. Furthermore, since it is unnecessary to dispose an FMM in close contact with the substrate, as in a conventional deposition process, the manufacturing time may be reduced according to embodiments of the present invention.

According to an embodiment of the present invention, the deposition source 1110, the deposition source nozzle unit 1120, and the patterning slit sheet 150 of the organic layer deposition assembly 1100 are not integrally formed as one body but may be formed as separate members within the deposition unit 730. According to the above structure, the deposition source 1110 may be easily inserted or removed so as to fill the deposition material 1115, or the patterning slit sheet 150 may be easily inserted or removed so as to clean or replace the blocking member 160.

Figure 11:
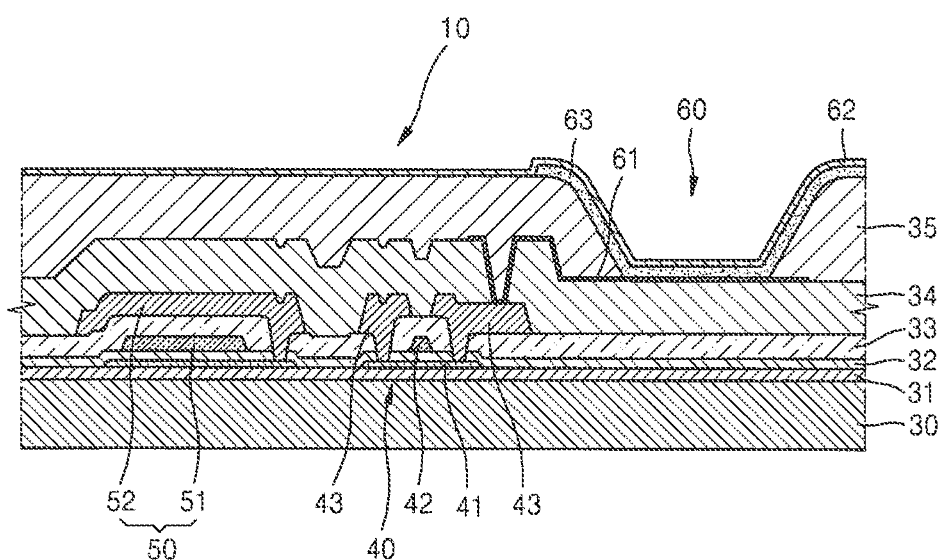
FIG. 11 is a schematic cross-sectional view of an active matrix organic light-emitting display apparatus manufactured by using an organic layer deposition apparatus, according to an embodiment of the present invention.

FIG. 11 is a schematic cross-sectional view of an active matrix organic light-emitting display apparatus 10 manufactured by using an organic layer deposition apparatus, according to an embodiment of the present invention.

Referring to FIG. 11, the active matrix organic light-emitting display apparatus 10 according to an embodiment of the present invention is formed on a substrate 30. The substrate 30 may be formed of a transparent material, such as glass, plastic, or metal, for example. An insulating layer 31, such as a buffer layer, may be formed on an entire surface of the substrate 30.

In one embodiment, a thin film transistor (TFT) 40, a capacitor 50, and an organic light-emitting diode (OLED) 60 are disposed on the insulating layer 31, as illustrated in FIG. 11.

In one embodiment, a semiconductor active layer 41 is formed on an upper surface of the insulating layer 31 in a predetermined pattern, and a gate insulating layer 32 is formed to cover the semiconductor active layer 41. The semiconductor active layer 41 may include a p-type or n-type semiconductor material.

A gate electrode 42 of the TFT 40 may be formed in a region of the gate insulating layer 32 corresponding to the semiconductor active layer 41, and an interlayer insulating layer 33 may be formed to cover the gate electrode 42. After the interlayer insulating layer 33 has been formed, the gate insulating layer 32 and the interlayer insulating layer 33 may be etched, for example (e.g., by dry etching), to form a contact hole exposing parts of the semiconductor active layer 41.

Next, a source/drain electrode 43 is formed on the interlayer insulating layer 33 to contact the semiconductor active layer 41 through the contact hole. A passivation layer 34 may be formed to cover the source/drain electrode 43, and may be etched to expose a part of the drain electrode 43. An insulating layer (not shown) may be further formed on the passivation layer 34 so as to planarize the passivation layer 34.

In addition, the OLED 60 displays predetermined image information by emitting red, green, or blue light as current flows. The OLED 60 includes a first electrode 61 disposed on the passivation layer 34. The first electrode 61 is electrically connected to the drain electrode 43 of the TFT 40.

A pixel defining layer 35 is formed to cover the first electrode 61. In one embodiment, a predetermined opening is formed in the pixel defining layer 35, and then an organic layer 63, including an emission layer, is formed in a region defined by the opening. A second electrode 62 is formed on the organic layer 63.

In one embodiment, the pixel defining layer 35, which defines individual pixels, is formed of an organic material. The pixel defining layer 35 also planarizes the surface of a region of the substrate 30 where the first electrode 61 is formed, and in particular, the surface of the passivation layer 34.

The first electrode 61 and the second electrode 62 are insulated from each other, and respectively apply voltages of opposite polarities to the organic layer 63, including the emission layer, to induce light emission.

The organic layer 63 may be formed of a low-molecular-weight organic material or a high-molecular-weight organic material. When a low-molecular-weight organic material is used, the organic layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like.

After the organic layer 63 is formed, the second electrode 62 may be formed by the same deposition method as used to form the organic emission layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode layer 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$), for example. Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr), or a compound thereof, for example, and forming a layer of ITO, IZO, ZnO, or $In_2O_3$ on the reflective layer. The first electrode 61 may be formed by forming a layer, such as by sputtering, for example, and then patterning the layer (e.g., by photolithography).

The second electrode 62 may also be formed as a transparent electrode or a reflective electrode. In one embodiment, when the second electrode 62 is formed as a transparent electrode, the second electrode 62 functions as a cathode. Such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63 and forming an auxiliary electrode layer or a bus electrode line thereon from ITO, IZO, ZnO, $In_2O_3$, or the like.

In one embodiment, when the second electrode 62 is formed as a reflective electrode, the reflective layer may be formed by depositing Li, Ca, LiF/Ca, LiF/Al, Al, Ag, Mg, or a compound thereof on the entire surface of the organic layer 63. The second electrode 62 may be formed by using the same deposition method as used to form the organic layer 63 described above.

The organic layer deposition apparatus according to embodiments of the present invention described above may be applied to form an organic layer or an inorganic layer of an organic TFT, and to form layers from various materials.

As described above, in an organic layer deposition apparatus and a method of manufacturing an organic light-emitting display apparatus by using the organic layer deposition apparatus according to embodiments of the present invention, the organic layer deposition apparatus may be easily manufactured and may be simply applied to manufacture large-sized display apparatuses on a mass scale, and manufacturing yield and deposition efficiency may be improved.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display apparatus using an organic layer deposition apparatus including a deposition source, a deposition source nozzle unit arranged at a side of the deposition source and including a plurality of deposition source nozzles, a patterning slit sheet facing the deposition source nozzle unit and including a plurality of patterning slits, a blocking member, and a heating member on the blocking member, the method comprising;

spacing a substrate which constitutes a target on which the deposition material is to be deposited apart from the organic layer deposition apparatus by a predetermined distance, the blocking member being between the substrate and the deposition source and blocking at least a portion of the substrate, the patterning slit sheet being smaller than the substrate in at least one of a first direction or a second direction perpendicular to the first direction;

heating the blocking member using the heating member;

discharging a deposition material from the organic layer deposition apparatus;

depositing the deposition material onto the substrate while moving at least one of the organic layer deposition apparatus or the substrate relative to the other, wherein the deposition material is patterned on the substrate by the patterning slit sheet in a pattern in which the deposition material is deposited at first regions on the substrate corresponding to the pattern slits and is not deposited at second regions on the substrate adjacent the first regions.

2. The method of claim 1, wherein the blocking member is shaped as an open mask.

3. The method of claim 1, wherein the blocking member is fixed on the deposition source.

4. The method of claim 1, wherein the blocking member blocks a non-layer-formation region of the substrate.

5. The method of claim 1, wherein the blocking member comprises a blocking member frame having a hollow window frame and an open mask sheet being thin and disposed inside the blocking member frame.

6. The method of claim 5, wherein the blocking member frame and the open mask sheet are integrally formed as one body.

7. The method of claim 5, wherein the heating member is accommodated in the blocking member frame.

8. The method of claim 5, wherein the blocking member frame is heated using the healing member, and heat applied to the blocking, member frame is transferred to the open mask sheet.

9. The method of claim 1, wherein heating, the blocking member comprises heating the blocking member such that the deposition material is not deposited on the blocking member.

10. The method of claim 9, wherein heating the blocking member comprises heating the blocking member at a greater temperature than a temperature at which the deposition material is vaporized.

11. The method of claim 1, wherein the heating member comprises a coil heater or a thin layer heater.

12. The method of claim 1, wherein deposition source nozzles of the plurality of deposition source nozzles are arranged in the first direction, and patterning slits of the plurality of patterning slits are arranged in the second direction.

13. The method of claim 1, wherein deposition source nozzles of the plurality of deposition source nozzles are arranged in the first direction, and patterning slits of the plurality of patterning slits are arranged in the first direction, and wherein the organic layer deposition apparatus further includes a barrier plate assembly comprising a plurality of barrier plates arranged between the deposition source nozzle unit and the patterning slit sheet in the first direction and partitioning a space between the deposition source nozzle unit and the patterning slit sheet into a plurality of sub-deposition spaces.

14. The method of claim 1, wherein the organic layer deposition apparatus further includes a chamber, and the patterning slit sheet is bound inside the chamber, and wherein deposition source nozzles of the plurality of deposition source nozzles are arranged in the first direction, and patterning slits of the plurality of patterning slits are arranged in the second direction.

* * * * *